United States Patent [19]
Takami et al.

[11] Patent Number: 6,054,222
[45] Date of Patent: Apr. 25, 2000

[54] EPOXY RESIN COMPOSITION, RESIN-ENCAPSULATED SEMICONDUCTOR DEVICE USING THE SAME, EPOXY RESIN MOLDING MATERIAL AND EPOXY RESIN COMPOSITE TABLET

[75] Inventors: Hiromichi Takami, Kawasaki; Kazutaka Matsumoto, Yokohama; Satoshi Takayama, Kawasaki; Tetsuo Okuyama, Yokohama, all of Japan

[73] Assignee: Kabushiki Kaisha Toshiba, Kawasaki, Japan

[21] Appl. No.: 09/026,338

[22] Filed: Feb. 19, 1998

[30] Foreign Application Priority Data

Feb. 20, 1997 [JP] Japan ................................ 9-036011

[51] Int. Cl.[7] ............................ B32B 17/10; B32B 27/38
[52] U.S. Cl. ......................... 428/417; 428/418; 523/204; 523/205; 523/207; 523/440
[58] Field of Search .................................... 523/440, 204, 523/205, 207; 428/417, 418

[56] References Cited

U.S. PATENT DOCUMENTS 5,116,885  5/1992  Hattori et al. ......................... 525/200

FOREIGN PATENT DOCUMENTS 5-175259  7/1993  Japan .
5-230188  9/1993  Japan .
5-239321  9/1993  Japan .

*Primary Examiner*—Robert Dawson
*Assistant Examiner*—D. Aylward
*Attorney, Agent, or Firm*—Oblon, Spivak, McClelland, Maier & Neustadt, P.C.

[57] ABSTRACT

An epoxy resin composition comprising (a) an epoxy resin, (b) a curing agent, (c) a cure accelerator and (d) silica powder. The silica powder (d) is composed of (d1) a first silica powder having a particle diameter ranging from 5 to 75 $\mu$m, (d2) a second silica powder having a particle diameter ranging from 0.2 to 0.9 $\mu$m, and (d3) a third silica powder having a particle diameter ranging from 0.01 to 0.08 $\mu$m.

20 Claims, 1 Drawing Sheet

EPOXY RESIN COMPOSITION, RESIN-ENCAPSULATED SEMICONDUCTOR DEVICE USING THE SAME, EPOXY RESIN MOLDING MATERIAL AND EPOXY RESIN COMPOSITE TABLET

BACKGROUND OF THE INVENTION

This invention relates to an epoxy resin composition which is suited for use in encapsulating a semiconductor element, and to a resin-encapsulated semiconductor device which is encapsulated (sealed) with the epoxy resin composition.

Epoxy resin is extensively employed as a sealing (encapsulating) material for various devices such as a transistor, an IC and an LSI, because epoxy resin is relatively cheap, high in productivity, and well balanced in various properties such as electric property, moisture resistance, heat resistance, mechanical property and adhesivity with an insert.

With the current trend to further increase the integration of semiconductor elements, a semiconductor chip is now increasingly enlarged and hence the package of resin-encapsulated semiconductor device is also increasingly enlarged. On the other hand, with an increasing miniaturization of mounting space, the package is now being made thinner.

In order to meet the demand for a high density packaging of electronic parts or for an automatization of assembling process, a surface mounting system is now becoming most popular as a mounting method of semiconductor devices in place of the conventional insertion system. As for a method of mounting a semiconductor package on a wiring circuit board according to this surface mounting system, various processes such as an infra-red ray reflow, a vapor phase reflow and a solder dipping have been adopted.

In any of these mounting processes, the package is entirely exposed to a high temperature in the order of 200 to 260° C., so that moisture absorbed in the resin encapsulating a semiconductor device may be suddenly expanded, thus giving rise to various problems such as the generation of a crack in the sealing resin or the peeling off of the sealing resin at an interface thereof with the semiconductor device, whereby badly deteriorating the reliability of the resin-encapsulated semiconductor device. Moreover, there have been observed various problem also in a semiconductor device sealed with a resin when the package is exposed to high temperatures, e.g. the passivation film protecting a wiring layer made of Al for instance may be cracked or a bonding wire may be disconnected.

In order to avoid these problems, the epoxy resin to be employed for sealing a semiconductor element is required to be low in stress intensity and excellent in solder reflow resistance. Furthermore, in order to meet the aforementioned trends of the enlargement of chip and of the thinning of package, the sealing resin is further required to be high in fluidity and excellent in moldability.

The low stress intensity and the solder reflow resistance can be improved by filling a filler in high density so as to lower the thermal expansion coefficient or water absorbency of the resin. In this case however, the melt viscosity of the resin would be greatly increased due to a high filling ratio of the filler, thus lowering the fluidity of the resin. With a view to solve this problem, there have been proposed various ideas, i.e. a method of employing a composition where fillers having various particle diameters are mixed with a resin (Japanese Patent Unexamined Publications H/5-230188, H/5-239190 and H/5-239321); and a method of employing a low viscosity bifunctional epoxy resin having a phenyl skeleton or a bisphenol skeleton in place of employing the conventional cresol novolak type epoxy resin.

However, when a semiconductor element is sealed with a lower-viscosity epoxy resin including aforementioned fillers, it is difficult to prevent the generation of void or burr due to the low viscosity of the resin composition. If the void volume of resin tablet is reduced by increasing the tableting density of the resin tablet (or the density of tablet) for sealing a semiconductor device, the generation of void may be inhibited. Accordingly, a method has been employed to pulverize the particle diameter of epoxy resin molding material as small as possible before tableting. On the other hand, the molding resin powder formed of the aforementioned low viscosity epoxy resin is so low in softening point that it can be easily blocked at room temperature and is poor in workability for forming tablet. At the same time, the employment of this low viscosity epoxy resin invites new problems such as the lowering of tableting density of the resin and the lowering of fluidity of tablet.

Furthermore, since the resin composition is low in viscosity, the resultant resin tablets tend to adhere to each other when they are stored for a long period of time. When resin tablets are adhered to each other, the transfer failure of the tablets may be caused at the occasion of automatic molding process. If the resin tablets adhered to each other in this manner are forcibly separated from each other, the fracture or deformation of the tablets may be caused, thus leading to the generation of voids after molding.

As mentioned above, it is difficult to avoid the generation of voids and burr if an epoxy resin sealing material which is excellent in fluidity and low in viscosity is employed for encapsulating a semiconductor device, and, because of this, it has been impossible to obtain an encapsulated semiconductor device having a sufficient reliability. Furthermore, a sealing material consisting of such an epoxy resin composition is accompanied with various problems when it is formed into powder or tablets.

BRIEF SUMMARY OF THE INVENTION

Accordingly, an object of the present invention is to provide an epoxy resin composition, which is excellent in fluidity and capable of forming a molded body which is minimal in void and burr.

Another object of the present invention is to provide a resin-encapsulated semiconductor device which is formed by making use of the aforementioned epoxy resin composition.

Another object of the present invention is to provide an epoxy resin molding material, which is composed of powder of an epoxy resin composition having a low stress intensity and an excellent solder reflow resistance, and which is free from blocking of resin powder, excellent in workability of tableting, capable of obtaining a resin tablet of high tableting density, and capable of manufacturing a high quality resin-encapsulated semiconductor device which is free from voids.

Another object of the present invention is to provide an epoxy resin composite tablet, which is low in viscosity at the occasion of injecting the resin and is free from adhesion between tablets.

Namely, according to the present invention, there is provided an epoxy resin composition comprising: (a) an epoxy resin; (b) a curing agent; (c) a cure accelerator; and (d) silica powder, wherein the silica powder (d) is composed of; (d1) a first silica powder having a particle diameter ranging from 5 to 75 μm; (d2) a second silica powder having a particle diameter ranging from 0.2 to 0.9 μm; and (d3) a third silica powder having a particle diameter ranging from 0.01 to 0.08 μm.

Further, according to the present invention, there is provided a resin-encapsulated semiconductor device comprising: a semiconductor element; and a resin layer encapsulating the semiconductor element; wherein the resin layer is constituted by a cured body of the aforementioned resin composition.

Furthermore, according to the present invention, there is provided an epoxy resin molding material comprising: a powder of epoxy resin composition comprising an epoxy resin, a curing agent and an inorganic filler; and an inorganic fine particle covering the surface of the powder and having an average particle diameter of 1 μm or less.

According to the present invention, there is further provided an epoxy resin composite tablet comprising: a tablet containing an epoxy resin composition comprising an epoxy resin, a curing agent and an inorganic filler; and a fine particle covering the surface of the tablet, wherein the fine particle has a melting or softening temperature which is higher than those of the epoxy resin composition.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
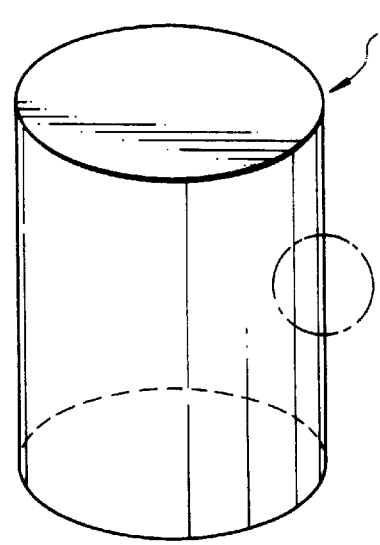
FIG. 1A is a perspective view schematically illustrating one example of epoxy resin composite tablet according to this invention.

This invention will be further explained in detail with reference to the following preferred embodiments. As for the epoxy resin to be mixed in an epoxy resin composition of this invention, any kinds of epoxy compound can be employed as long as it contains in its molecule two or more epoxy groups. Examples of such an epoxy resin are bisphenol A type epoxy resin, bisphenol F type epoxy resin, bisphenol S type epoxy resin, biphenyl type epoxy resin, phenol novolak type epoxy resin, cresol novolak type epoxy resin, naphthol novolak type epoxy resin, novolak epoxy resin of bisphenol A, an epoxidized tris(hydroxyphenyl) alkane to be derived from the epoxidation of a condensate of phenol or alkylphenol with hydroxybenzaldehyde, epoxidized tetra(hydroxyphenyl) alkane, 2,2',4,4'-tetraglycidoxybenzophenone, triglycidyl ether of p-aminophenol, polyalkaneglycidyl ether, 1,3,5-triglycidyl ether benzene, 1,2,3-triglycidyl ether benzene, glycidyl ether of phenol aralkyl resin, naphthalenediol type epoxy resin, alicyclic epoxy resin, epoxy resins to be derived from tri or tetra(hydroxyphenyl) alkane, and bishydroxybiphenyl type epoxy resin. These epoxy resins may be employed singly or as a mixture consisting of two or more kinds.

In particular, the employment of an epoxy resin represented by the following general formula (1) or (2) is advantageous for improving the reflow crack resistance of the resin composition.

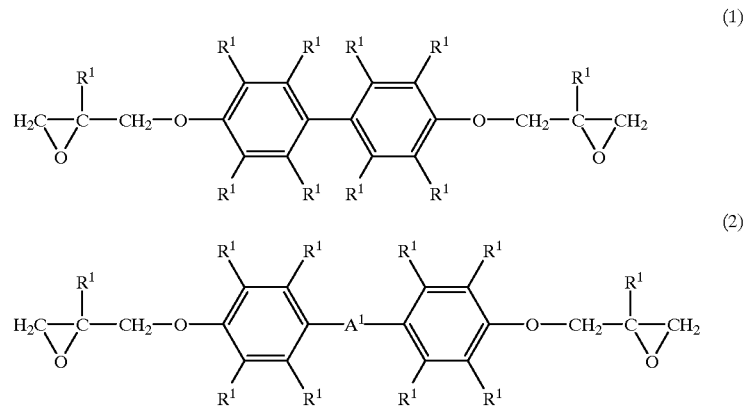

wherein $R^1$s may be the same or different and are individually selected from the group consisting of hydrogen atom, alkyl group such as methyl, ethyl, propyl, etc., cycloalkyl group such as cyclohexyl, cyclopentyl, etc., aryl group such as phenyl, naphthyl, anisyl, etc., and a halogen atom; $A^1$ is a bivalent organic group, such as —O—, —S—, —Se—, —Te—, or any one of the following groups:

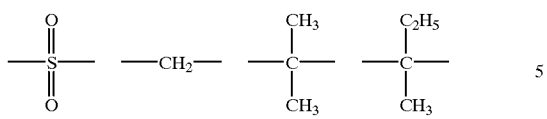

The aforementioned epoxy compounds can be suitably selected depending on the (b) component employed as a curing agent in the resin composition of this invention. Further, the mixing ratio of the epoxy resin in the resin composition of this invention can be suitably determined by taking the adjustment of melt viscosity and the thermal expansion coefficient of molded product into consideration. Generally, the mixing ratio of the epoxy resin in the resin composition is in the range of from 3 wt. % to 10 wt. % based on the resin composition.

As for the curing agent constituting the (b) component in the epoxy resin composition of this invention, phenol resin can be employed. Specific examples of phenol resin useful in this case are novolak type phenol resins such as phenol novolak resin, cresol novolak resin, nonylphenol novolak resin, bisphenol F type novolak resin, bisphenol A type novolak resin, biphenyl type phenol resin and naphthol type novolak resin; phenol aralkyl resin formed of a condensation polymer to be derived from 2,2'-dimethoxy-p-xylene and a phenol monomer; dicyclopentadiene phenol copolymer; hydroquinone; resorcinol; catechol; 1,2,3-trihydroxy benzene; and 1,3,5-trihydroxy benzene. Further it is also possible to employ as a curing agent, a polyfunctional phenol resin such as t-butylphenol novolak resin, polyparahydroxy styrene, tris(hydroxyphenyl) alkane, etc.; and a phenol resin having terpene skeletons. These phenol resins may be employed singly or as mixture consisting of two or more kinds.

In particular, the employment of a phenol resin represented by the following general formula (3) or (4) is advantageous for improving the heat resistance of the resin composition.

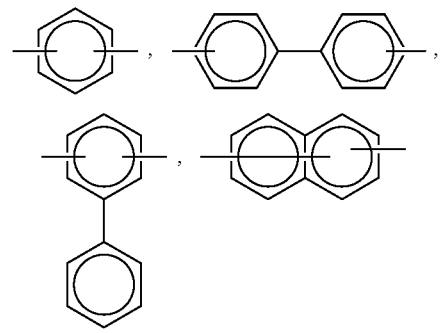

According to this invention, the mixing ratio between the epoxy resin component and the phenol resin component should preferably be adjusted in such a manner that the ratio between the number of phenolic hydroxyl group of the phenol resin constituting a curing agent and the number of epoxy group of the epoxy resin (number of phenolic hydroxyl group/number of epoxy group) falls within a range of 0.5 to 1.5. More preferably, the ratio is within the range of 0.8 to 1.2.

If the ratio is less than 0.5, it would be difficult to cause curing reaction sufficiently. On the other hand, if the ratio exceeds over 1.5, curing property in particular moisture resistance may be deteriorated.

As for the cure accelerator constituting the (c) component of this invention, an amine type, phosphorus type, boron type or phosphorus-boron type cure accelerator can be employed. For example, an organic phosphine compound such as triphenyl phosphine, tri(p-methylphenyl) phosphine, methyldiphenyl phosphine and tris(2,6-dimethoxyphenyl) phosphine; an imidazole compound or derivatives thereof such as 2-ethylimidazole, 2,4-dimethylimidazole, 2-ethyl-4-methylimidazole, 2-phenylimidazole and 2-heptadecylimidazole; DBU (1,8-diazabicycloundec-7-ene) or the salt of DBU, or 6-dibutylamino-1,8-diazabicycloundec-7-ene may be employed.

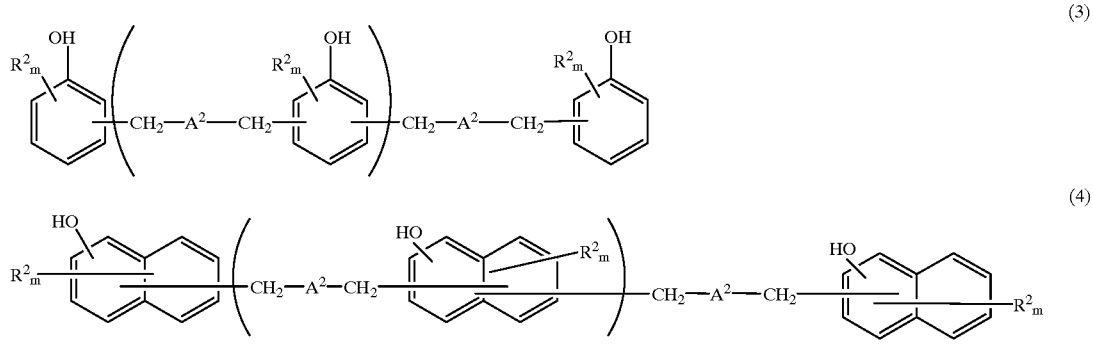

wherein $R^2$s may be the same or different and are individually selected from the group consisting of hydrogen atom, alkyl group such as methyl, ethyl, propyl, etc., cycloalkyl group such as cyclohexyl, cyclopentyl, etc., aryl group such as phenyl, naphthyl, anisyl, etc., and a halogen atom; $A^2$ is a bivalent organic group selected from the group consisting of the following groups; m is an integer of 0 to 3; and n is an integer of 1 to 50:

The resin composition incorporated with a phosphorus type cure accelerator in particular among these cure accelerators is excellent in moisture resistance after curing, thus rendering it to be suited for use in encapsulating a semiconductor element. The mixing ratio of the aforementioned cure accelerator in the resin composition should preferably be in the range of 0.05 to 5% by weight based on the total amount of the resin composition. If the mixing ratio of the cure accelerator is less than 0.05% by weight, the effects of the cure accelerator may become insufficient. On the other hand, if the mixing ratio of the cure accelerator exceeds over 5% by weight, the time for gelation becomes too short, so that it may cause imperfect filling of the resin composition into a cavity.

The resin composition of this invention comprises silica powder (component (d)) as an inorganic filler, and this silica powder is constituted by three kinds of silica powder each differing in particle diameter from each other, i.e. (d1) a first silica powder having a particle diameter ranging from 5 to 75 μm; (d2) a second silica powder having a particle diameter ranging from 0.2 to 0.9 μm; and (d3) a third silica powder having a particle diameter ranging from 0.01 to 0.08 μm. Although there is not any particular restriction regarding the features of each silica powder as long as they meet the aforementioned conditions regarding the particle diameter, the employment of silica powder which has been made hydrophobic through a treatment as the third silica powder (d3) is preferable in view of improving the moisture resistance reliability. In view of preventing a soft error, the content of uranium (U) as well as of thorium (Th) should preferably be limited to 0.5 ppb or less.

The mixing ratio in total of these three kinds of silica powder should preferably be 85 wt. % or more based on the entire resin composition. If this mixing ratio is less than 85 wt. %, the mechanical strength of the resin layer after curing would be deteriorated. However, if the mixing ratio of silica powder is excessive, not only the workability such as kneading operation for instance of the resultant resin composition would be badly affected, but also the fluidity of thereof would be hardly kept as sufficiently high as desired. Therefore, the mixing ratio in total of these three kinds of silica powder should preferably be at most 95 wt. %.

The mixing ratios of the (d1) component, (d2) component and (d3) component based on the total of these three kinds of silica powder should preferably be 50 to 90 wt. %, 10 to 35 wt. %, and 0.1 to 5 wt. %, respectively. Furthermore, the weight ratio between the (d1) component and the (d2) component ((d1):(d2)) should preferably be in the range of 88:12 to 60:40. When the weight ratio between the (d1) component and the (d2) component, and the mixing ratio among these three components (d1), (d2) and (d3) are confined to the aforementioned ranges, the viscosity of the resin composition would be sufficiently lowered. Further, when the mixing ratios of the (d2) component and the (d3) component confined to the aforementioned ranges, the burr of cured product to be obtained would be minimized in spite of the fact that the viscosity of the resin composition is lowered.

Further, when the mixing ratio among three kinds of components (d1), (d2) and (d3) of silica powder which differ in particle diameter from each other is combined in the aforementioned ranges, the resultant resin composition becomes thixotropic in nature, so that the generation of void in the resin layer after curing can be minimized. As explained above, since the epoxy resin composition incorporated with specific three kinds of silica powder is low in viscosity and thixotropic in nature, it is possible to realize an excellent adhesivity with a lead frame, etc. when it is employed for encapsulating a semiconductor element. Accordingly, it is possible to manufacture a resin encapsulated semiconductor device which is excellent in heat resistance, moisture resistance and reflow crack resistance.

The inorganic filler to be incorporated into the resin composition in this invention is not limited to the aforementioned three kinds of silica powder. Namely, it is possible to incorporate silica powder of different particle size from those of three kinds of components (d1), (d2) and (d3) of silica powder in the resin composition as long as the particle size thereof is confined to the range which is not smaller than the minimum particle diameter of the (d3) component and not larger than the maximum particle diameter of the (d1) component. The mixing ratio of silica powder of such a different particle size may be suitably selected as long as the mixing ratio of three kinds of components (d1), (d2) and (d3) of silica powder is kept within the aforementioned range. For example, silica power having a particle diameter of 2 to 5 μm may be incorporated in the resin composition.

Furthermore, when one or two or more kinds of additives selected from silicone oil, silicone gel, silicone rubber, ABS resin powder and MBS resin powder are incorporated into the epoxy resin composition of this invention, the elastic modulus of the resin composition can be lowered and the reflow crack resistance of the resin composition can be improved.

Additionally, a releasing agent such as natural wax, synthetic wax, linear fatty acid or metal salts thereof, acid amides, esters and paraffins; a pigment such as carbon black and titanium dioxide; a surface-treating agent such as silane coupling agent; and a flame retardant such as antimony trioxide may be added to the epoxy resin composition of this invention.

The epoxy resin composition of this invention can be easily prepared by kneading and melting all of the components by making use of hot rolls, a kneader or an extruder, by mixing all of the components by making use of a special mixer which is capable of pulverizing the components, or by suitably combining any of these method.

As for the method of sealing or encapsulating a semiconductor element with a resin composition of this invention, a low pressure transfer molding method can be generally employed. However, the sealing method is not restricted to the transfer molding, but any other sealing methods such as a compression molding, an injection molding or a cast molding can be employed for sealing a semiconductor element. The post-curing should preferably be performed at a temperature of not less than 175° C. There are no limitations regarding the kinds and size of the semiconductor element to be sealed with the resin composition according to this invention, i.e. any kinds of semiconductor chip can be sealed in accordance with the purpose and end-use thereof.

Since three kinds of silica power each differing in particle size are incorporated in the epoxy resin composition according to this invention, the epoxy resin composition is excellent in fluidity, and a molded product to be obtained form the epoxy resin composition is limited in generation of burr. Moreover, since the characteristics inherent to epoxy resin, such as electric property, moisture resistance, etc. are not affected by the inclusion of these three kinds of silica power, it is possible, by sealing a semiconductor element with this epoxy resin composition, to manufacture a resin-encapsulated semiconductor device exhibiting high reliability.

Next, the details of the epoxy resin molding material according to this invention will be explained.

The epoxy resin molding material according to this invention is formed of particles of epoxy resin composition comprising epoxy resin, a curing agent and an inorganic filler, each particle being covered by inorganic fine particles having an average particle diameter of 1 μm or less.

As for the kinds of epoxy resin and of curing agent constituting the components of the epoxy resin composition, the same compounds as explained herein-above can be employed in the same mixing ratios as explained herein-above.

Next, the details of the inorganic fine particle for covering the surface of the resin power of epoxy resin composition will be explained. This inorganic fine particle functions to prevent the epoxy resin power from blocking.

There is not any particular limitation regarding the kinds of the inorganic fine particle as long as the average particle diameter thereof is as fine as 1 $\mu$m or less. For example, inorganic oxide fine particles made of silica, alumina, titanium oxide, etc.; inorganic nitride fine particles made of silicon nitride, aluminum nitride, boron nitride, etc.; inorganic carbide fine particles made of silicon carbide; and carbon black may be employed. In particular, an inorganic fine particle having an average particle diameter ranging from 0.001 to 0.1 $\mu$m is preferable for use. Specific examples of such an ultra-fine particle are silica fine particles such as Aerosil 200, 300 and OX-50; hydrophobic silica fine particles such as Aerosil R972 and R974; high-purity ultra-fine particulate alumina; and high-purity ultra-fine particulate titanium oxide.

If the average particle diameter of the inorganic fine particle is more than 1 $\mu$m, the surface of resin particles of the epoxy resin composition cannot be covered with a sufficient quantity of the inorganic fine particles, thereby deteriorating the effect thereof to prevent the blocking of the resin particles. Furthermore, when a resin tablet or a cured product is manufactured using the resin particles covered by the inorganic particles having such a large particle diameter, the existence of scattered inorganic fine particles on the surface of the tablet or cured product would stand out more conspicuously, thus making the resultant molded product defective or undesirable in external appearance.

If an organic fine particle such as a resin power or a parting compound powder is employed in place of an inorganic fine particle for manufacturing an epoxy resin molding material, it will result in a molding material having an increased water absorption, thus deteriorating the solder reflow resistance of the molding material.

Although there is not any particular restriction with respect to the mixing ratio of the aforementioned inorganic fine particle, a mixing ratio ranging from 0.01 to 1 part by weight per 100 parts by weight of a powder of the epoxy resin composition is preferable. If this mixing ratio is less than 0.01 part by weight, the effect of the inorganic fine particle to prevent the blocking of the resin powder may become insufficient. On the other hand, if this mixing ratio exceeds over 1 part by weight, the melt viscosity of the epoxy resin molding material would be increased, whereby possibly deteriorating the fluidity of the molding material.

The manufacture of the epoxy resin molding material of this invention can be performed as follows. First of all, an epoxy resin composition is prepared by means of melt kneading or mixing. The resin composition is pulverized and at the same time, the surface of pulverized particle is allowed to be covered by inorganic fine particles. The covering of pulverized particle by inorganic fine particles may be performed after the step of pulverizing the resin composition or after the step of granulation of the resin composition powder. The melt kneading can be performed by making use of hot rolls, a kneader or an extruder, and the mixing of the resin composition can be performed by making use of a special mixer which is capable of pulverizing the resin composition. These methods may be suitably combined with each other.

The epoxy resin composition prepared in this manner is then pulverized by making use of an impact grinder to obtain a resin powder. The term, "resin powder" in this case includes granular powder. According to this invention, the granular powder is defined as follows. Namely, the granular powder is that to be obtained by means of a pelletizer for instance, and contains particles of 0.1 mm or less in particle diameter at a ratio of 5 wt. % or less based on the total powder. In this case, the particle diameter of epoxy resin power should preferably be 3 mm or less, more preferably 2 mm or less. If the particle diameter of epoxy resin power exceeds over 3 mm, tableting density of the resin tablet may be lowered, thus generating voids in a molded product and hence increasing the ratio of defective moldings.

The shape of the epoxy resin composition in the epoxy resin molding material of this invention is not limited to spherical, but may be non-spherical such as a pellet-like shape. When the shape of the epoxy resin composition is non-spherical, the length of longer side thereof should preferably be 3 mm or less.

After the manufacture of epoxy resin powder of predetermined particle size, the epoxy resin powder is mixed with the aforementioned inorganic fine particles in a powder mixer such as a twin-cylinder mixer to obtain a mixture. Subsequently, a mechanical impact is given to the mixture, whereby allowing the surface of a powder of the epoxy resin composition to be covered by the aforementioned inorganic fine particles. The conditions in the aforementioned mixing step can be suitably determined depending on the kind of the inorganic fine particles. However, it is generally possible to obtain a homogeneous mixture by mixing the raw materials in a twin-cylinder mixer at room temperature for 10 to 60 minutes and at a rotational speed of 10 to 30 rpm.

As for the means for giving a mechanical impact to the powder mixture, any desired method can be employed. For example, a high-speed high-shearing mixer such as a Henschel mixer and a super mixer; an impact grinder such as hammer mill; a hybridization system utilizing a high-speed in-air impacting method; or a mechanofusion utilizing a dry mechanochemical method may be suitably employed. When a Henschel mixer is employed in this case, the mixture comprising an epoxy resin composition powder and the aforementioned inorganic fine particles are subjected to a high-speed mixing treatment at a rotational speed of 2,000 to 5,000 rpm, whereby rendering the surface of the powder to be covered by the inorganic fine particles.

If an epoxy resin composition powder and the aforementioned inorganic fine particles are merely mixed together using only a powder mixer such as a twin-cylinder mixer without giving a mechanical impact to the mixture, there would be obtained a product wherein the inorganic fine particles are weakly adhered onto the surface of the resin powder so that the inorganic fine powders would be easily desorbed from the surface of the resin powder. Therefore, the resin powder cannot be kept covered by the inorganic fine particles so that it would be difficult to prevent the blocking of the resin powder.

The sealing or encapsulation of a semiconductor element with an epoxy resin molding material of this invention can be performed by any suitable means as in the case of manufacturing the aforementioned epoxy resin composition depending on the purpose and end-use thereof, such as a low pressure transfer molding, an injection molding, a compression molding, etc. The epoxy resin molding material according to this invention can be employed after it is formed into a tablet, or can be charged in a state of powder (including granule) into a molding machine.

Since the surface of a powder of epoxy resin composition is covered by an inorganic fine particles having an average particle diameter of 1 $\mu$m or less in the epoxy resin molding material of this invention, the blocking of resin powder can be effectively prevented without badly affecting the fluidity of the epoxy resin molding material. Therefore, it is possible, by making use of the epoxy resin molding material of this invention, to improve the workability to form a tablet and at the same time to obtain a resin tablet having a high density. Further, it is possible, by making use of such a resin tablet for an encapsulation of an semiconductor element, to manufacture a resin-encapsulated semiconductor device which is free from voids in the resin layer and excellent in reliability. Furthermore, since the resin powder is free from blocking, even when the resin powder is employed for molding as it is without being transformed into a tablet, the resin powder can be transferred smoothly and molded into a product which is free from voids.

Next, the details of the resin composite tablet according to this invention will be explained.

The resin composite tablet according to this invention is constituted by a tablet which is formed of an epoxy resin composition comprising an epoxy resin, a curing agent and an inorganic filler, and by fine particles covering the surface of the tablet and having a softening or melting point which is higher than those of the tablet.

It has been found, after the investigation made by the present inventors on the cause for the problems in the conventional tablet, that the problems fundamentally reside in a direct contact between surfaces of tablet constituted by a low viscosity resin, thereby causing a bond between the tablets, i.e. low viscosity resins each constituting the surface of the tablet. This invention has been accomplished based on these findings. Namely, the present inventors have found that the adhesion or blocking between the tables can be prevented if the resin tablet is provided with a surface layer constituted by a composition which differs from the epoxy resin composition constituting the interior of the tablet, more specifically with a surface layer containing fine particles which are capable of preventing the bonding between low viscosity resins even if these low viscosity resins are directly contacted with other.

As for the epoxy resin, curing agent and inorganic filler constituting the components of the epoxy resin composition in the resin composite tablet of this invention, the same kinds of compound which are exemplified in the aforementioned epoxy resin molding material can be employed in the same mixing ratios as illustrated hereinbefore. If desired, additives such as a silane coupling agent, a catalyst, a releasing agent, a colorant, a modifier, a flame retardant, etc. can be further incorporated in the resin composition. Specific examples of these additives as well as the mixing ratio thereof may be the same as described hereinbefore.

The fine particles constituting the surface layer of the resin composite tablet have a softening point or melting point which is higher than those of the epoxy resin composition constituting the main body of the tablet. The fine particles having such properties are capable of functioning as a spacer for preventing the adhesion or blocking between the tablets. Specific examples of the fine particles are an inorganic powder formed of an inorganic oxide material, an inorganic nitride material or an inorganic carbide material; a powder of a thermosetting resin composition which differs in composition from the epoxy resin composition constituting the main body of the tablet; and a powder of an organic material having a melting or softening point of 50° C. or more.

More specific examples of the fine particles are an inorganic material powder (such as a powder of an inorganic oxide material such as titanium oxide, aluminum oxide, etc.; the fine powder of an inorganic nitride material such as silicon nitride, aluminum nitride, etc.; and the fine powder of inorganic carbide material such as silicon carbide); and a powder of a thermosetting resin composition which differs in composition from the epoxy resin composition constituting the interior of the tablet (such as a filler-rich resin composition where the weight ratio of silica fine particle as a filler is higher than that of the interior of the tablet by several %; and a thermosetting resin composition comprising cresol novolak epoxy resin, novolak phenol resin as a curing agent, silica fine particle as a filler, silane coupling agent, a catalyst, etc., and having a higher glass transition point than that of the main body of the tablet). Furthermore, a powder of a silicone polymer material such as silicone rubber; a powder of a thermoplastic organic material having a melting point of 50° C. or more, such as a high-melting point wax, a higher fatty acid, a higher alcohol and a mixture of higher alcohols; a powder of a thermoplastic resin having a melting point of 50° C. or more, such as polypropylene, polymethylpentene, amorphous polyolefin, polystyrene, PPS, PEEK and PET; and a powder of a heat resistant organic material such as polydivinyl benzene, teflon and polyimide may be employed.

When fine particles consisting of a thermoplastic material is selected out of these various kinds of fine particles, part or all of the fine particles which have been applied to cover an epoxy resin tablet may be heat-treated to integrate the fine particles with the tablet, thus rendering them to function as a spacer.

In order to avoid the fine particles from being recognized as a foreign matter on the surface of resin-encapsulated semiconductor device when the epoxy resin composite tablets of this invention are employed for encapsulating a semiconductor element, the hue of the fine particles should be adjusted to conform with the color of the main body of tablet, thereby making it excellent in external appearance.

The epoxy resin composite tablet of this invention can be manufactured as follows. First of all, an epoxy resin composition is prepared by means of the aforementioned melt kneading or mixing, and then the composition which has been solidified after melting is pulverized and classified to obtain a resin powder. Subsequently, the resin powder is compression-molded to obtain the epoxy resin tablet. Then, the fine particles are coated on the surface of the epoxy resin tablet by means of spraying or brushing to manufacture the epoxy resin composite tablet.

Alternatively, the covering of the surface of tablet with the fine particles may be performed in concurrent with the step of forming the tablet. For example, the fine particles are electrostatically charged in advance, and then the inner surface of a mold is electrostatically covered by making use of the fine particles before an epoxy resin powder is introduced into the mold for forming the main body of tablet. Subsequently, the epoxy resin powder is introduced into the mold, whereby forming an integral body consisting of the main body of tablet and the fine particles attached thereon. According to this method, the adhesion of the resin powder to the mold at the step of forming the tablet can be prevented, thus presenting a merit that the yield of tablet can be improved.

The epoxy resin composite tablet thus manufactured is then employed according to the conventional method for encapsulating any desired semiconductor chip, whereby manufacturing a resin-encapsulated semiconductor device.

According to the epoxy resin composite tablet of this invention, since the surface of the main body of resin tablet comprising an epoxy resin composition is covered by a specific kind of fine particles, it is possible to prevent the adhesion or blocking between tablets even if the tablets are left standing for a long period of time. Even if the tablets are happened to be bonded to each other, the bonding strength thereof would be very weak. Therefore, it is possible to easily separate the bonded tablets from each other without inviting a generation of defective tablet in shape, such as the fracture or deformation of tablet. Therefore, the transferability of the tablet at the tablet-charging funnel of molding machine would be improved. Further, since the epoxy resin composite tablet according to this invention is free from malformation, it is possible to manufacture a resin-encapsulated semiconductor device which is free from malformation and excellent in reliability.

This invention will be further explained in detail with reference to the following examples, which are not intended to restrict the scope of this invention.

EXAMPLE I

First of all, an epoxy resin composition was prepared by incorporating therein an inorganic filler comprising three kinds of silica powder, each differing in particle diameter. Then, the epoxy resin composition was employed for encapsulating a semiconductor element, thus preparing a resin-encapsulated semiconductor device.

The components contained in the epoxy resin composition of this Example are as follows.
(Epoxy resin)
  (I-A): bishydroxybiphenyl type epoxy resin (YX-4000H, Yuka Shell Epoxy Kabushikikaisha, epoxy equivalent: 193)
  (I-B): diphenyl methane type epoxy resin (ESLV-80XY, Nippon Steel Chemical Co., Ltd., epoxy equivalent: 196)
  (I-C): diphenyl methane type epoxy resin (GK-8001, Nippon Steel Chemical Co., Ltd., epoxy equivalent: 205)
(Curing agent)
  (I-A): phenol aralkyl resin (XL-225-4L, Mitsui Toatsu Chemicals Co., Ltd., hydroxyl equivalent: 170)
  (I-B): naphthol type phenol aralkyl resin (SN-180, Nippon Steel Chemical Co., Ltd., hydroxyl equivalent: 191)
(Other components)
  Curing accelerator I: triphenyl phosphine
  Additive I: epoxy-terminated polysiloxane (KF-105, Shin-Etsu Chemical Co., Ltd.)
  Coupling agent I: γ-glycidoxypropyl trimethoxysilane
  Releasing agent I: ester type wax
  Pigment I: carbon black
(Silica powder)
  A: particle diameter 5–75 μm, average particle diameter 25 p m
  B: particle diameter 2–5 μm, average particle diameter 4 μm
  C: particle diameter 1–2 μm, average particle diameter 1.6 μm
  D: particle diameter 0.2–0.9 μm, average particle diameter 0.5 μm
  E: particle diameter 0.1–0.2 μm, average particle diameter 0.15 μm
  F: particle diameter 0.01–0.08 μm, average particle diameter 0.04 μm
  G: particle diameter 0.01–0.08 μm, average particle diameter 0.04 μm (hydrophobic product)

These components were mixed together according to the formulations shown in the following Tables 1 to 4 to prepare the epoxy resin compositions of Examples (I-1) to (I-10), Comparative Examples (I-1) to (I-11) and Reference Examples (I-1) to (I-6). The mixing amounts shown in Tables 1 to 4 are based on weight parts.

These epoxy resin compositions were prepared as follows. First of all, the inorganic filler was surface-treated by using a coupling agent in a Henschel mixer. Then, other components such as epoxy resin, curing agent, etc. were mixed together and then kneaded by means of hot rolls at a temperature of 60 to 130° C. to obtain a mixture. Then, the resultant mixture was cooled and pulverized to obtain an epoxy resin composition. The additive was added in the form of mixture with an epoxy resin or a phenol resin. Namely, the additive was added to and mixed with an epoxy resin or a phenol resin which had been molten in advance at a temperature of 140° C., and, after being cooled, was pulverized to obtain a mixture consisting of the epoxy resin or the phenol resin and the additive.

TABLE 1

| | Examples | | | | | | | | | |
|---|---|---|---|---|---|---|---|---|---|---|
| | I-1 | I-2 | I-3 | I-4 | I-5 | I-6 | I-7 | I-8 | I-9 | I-10 |
| Epoxy resin I-A | 5.5 | 5.5 | 5.5 | 5.5 | | | 5.5 | | | 5.5 |
| Epoxy resin I-B | | | | | 5.5 | | | 5.5 | | |
| Epoxy resin I-C | | | | | | 5.5 | | | 5.5 | |
| Curing agent I-A | 5.0 | 5.0 | 5.0 | 5.0 | 5.0 | 5.0 | | | | 5.0 |
| Curing agent I-B | | | | | | | 5.0 | 5.0 | 5.0 | |
| Cure accelerator I | 0.20 | 0.20 | 0.20 | 0.20 | 0.20 | 0.20 | 0.20 | 0.20 | 0.20 | 0.20 |
| Additive I | 0.3 | 0.3 | 0.3 | 0.3 | 0.3 | 0.3 | 0.3 | 0.3 | 0.3 | 0.3 |
| Coupling agent I | 0.4 | 0.4 | 0.4 | 0.4 | 0.4 | 0.4 | 0.4 | 0.4 | 0.4 | 0.4 |
| Releasing agent I | 0.2 | 0.2 | 0.2 | 0.2 | 0.2 | 0.2 | 0.2 | 0.2 | 0.2 | 0.2 |
| Pigment I | 0.3 | 0.3 | 0.3 | 0.3 | 0.3 | 0.3 | 0.3 | 0.3 | 0.3 | 0.3 |
| Silica powder A | 84 | 80 | 65 | 80 | 80 | 80 | 80 | 70 | 80 | 70 |
| Silica powder B | | | | | | | | 10 | | 10 |
| Silica powder C | | | | | | | | | | |
| Silica powder D | 15 | 19 | 32 | 19 | 19 | 19 | 19 | 19 | 19 | 19 |
| Silica powder E | | | | | | | | | | |
| Silica powder F | | 1 | | | | | | | | |
| Silica powder G | 1 | | 3 | 1 | 1 | 1 | 1 | 1 | 1 | 1 |

TABLE 2

| | Comparative example | | | | | |
|---|---|---|---|---|---|---|
| | I-1 | I-2 | I-3 | I-4 | I-5 | I-6 |
| Epoxy resin I-A | 5.5 | 5.5 | 5.5 | 5.5 | 5.5 | 5.5 |
| Epoxy resin I-B | | | | | | |
| Epoxy resin I-C | | | | | | |
| Curing agent I-A | 5.0 | 5.0 | 5.0 | 5.0 | 5.0 | 5.0 |
| Curing agent I-B | | | | | | |
| Cure accelerator I | 0.20 | 0.20 | 0.20 | 0.20 | 0.20 | 0.20 |
| Additive I | 0.3 | 0.3 | 0.3 | 0.3 | 0.3 | 0.3 |
| Coupling agent I | 0.4 | 0.4 | 0.4 | 0.4 | 0.4 | 0.4 |
| Releasing agent I | 0.2 | 0.2 | 0.2 | 0.2 | 0.2 | 0.2 |
| Pigment I | 0.3 | 0.3 | 0.3 | 0.3 | 0.3 | 0.3 |
| Silica powder A | 100 | | | 99 | | 80 |
| Silica powder B | | 100 | | | | |
| Silica powder C | | | 100 | | | |
| Silica powder D | | | | | 99 | 20 |
| Silica powder E | | | | | | |
| Silica powder F | | | | | | |
| Silica powder G | | | | 1 | 1 | |

TABLE 3

| | Comparative example | | | | |
|---|---|---|---|---|---|
| | I-7 | I-8 | I-9 | I-10 | I-11 |
| Epoxy resin I-A | 5.5 | 5.5 | 5.5 | 5.5 | 5.5 |
| Epoxy resin I-B | | | | | |
| Epoxy resin I-C | | | | | |
| Curing agent I-A | 5.0 | 5.0 | 5.0 | 5.0 | 5.0 |
| Curing agent I-B | | | | | |
| Cure accelerator I | 0.20 | 0.20 | 0.20 | 0.20 | 0.20 |
| Additive I | 0.3 | 0.3 | 0.3 | 0.3 | 0.3 |
| Coupling agent I | 0.4 | 0.4 | 0.4 | 0.4 | 0.4 |
| Releasing agent I | 0.2 | 0.2 | 0.2 | 0.2 | 0.2 |
| Pigment I | 0.3 | 0.3 | 0.3 | 0.3 | 0.3 |
| Silica powder A | 50 | 80 | 80 | 80 | 80 |
| Silica powder B | 30 | | | | |
| Silica powder C | | 1 | | 19 | 19 |
| Silica powder D | 20 | 19 | 19 | | |
| Silica powder E | | | 1 | | 1 |
| Silica powder F | | | | | |
| Silica powder G | | | | 1 | |

TABLE 4

| | Reference example | | | | | |
|---|---|---|---|---|---|---|
| | I-1 | I-2 | I-3 | I-4 | I-5 | I-6 |
| Epoxy resin I-A | 5.5 | 5.5 | 5.5 | 5.5 | 5.5 | 5.5 |
| Epoxy resin I-B | | | | | | |
| Epoxy resin I-C | | | | | | |
| Curing agent I-A | 5.0 | 5.0 | 5.0 | 5.0 | 5.0 | 5.0 |
| Curing agent I-B | | | | | | |
| Cure accelerator I | 0.20 | 0.20 | 0.20 | 0.20 | 0.20 | 0.20 |
| Additive I | 0.3 | 0.3 | 0.3 | 0.3 | 0.3 | 0.3 |
| Coupling agent I | 0.4 | 0.4 | 0.4 | 0.4 | 0.4 | 0.4 |
| Releasing agent I | 0.2 | 0.2 | 0.2 | 0.2 | 0.2 | 0.2 |
| Pigment I | 0.3 | 0.3 | 0.3 | 0.3 | 0.3 | 0.3 |
| Silica powder A | 89 | 55 | 50 | 80 | 76 | 80 |
| Silica powder B | | | 30 | | | |
| Silica powder C | | | | | | |
| Silica powder D | 10 | 44 | 19 | 19.95 | 18 | 19 |
| Silica powder E | | | | | | |
| Silica powder F | | | | | | |
| Silica powder G | 1 | 1 | 1 | 0.05 | 6 | 1 |

Then, the epoxy resin compositions of Examples (I-1) to (I-10), Comparative Examples (I-1) to (I-11) and Reference Examples (I-1) to (I-6) were subjected to the following evaluation tests.

(1) Viscosity:

A columnar tablet having a bottom area of 1 cm² was prepared by making use of 2.5 g of a powder material. Then, the viscosity of the tablet was measured by means of a flow tester, CFT-500A type (Shimazu Corporation) at a temperature of 180° C., using a nozzle having a diameter of 0.5 mm φ and a length of 1 mm, and applying three kinds of loads, 10 kg, 40 kg and 80 kg to the test samples.

(2) Flexural strength and flexural modulus:

Test pieces (10 mm×4 mm×80 mm) of each epoxy resin composition were prepared by way of transfer molding under the conditions of 180° C. and one minute, the resultant molded pieces being post-cured over 8 hours at a temperature of 175° C. to prepare test samples. Some of test samples thus obtained were subjected to a three-point bending test with the distance between supports being set to 64 mm and the crosshead speed being set to 2 mm/min., thereby measuring the flexural strength and flexural modulus of the test samples. On the other hand, the other test samples were left standing in an atmosphere of a temperature of 240° C. for 4 minutes in advance and then subjected to the aforementioned three-point bending test in the same conditions as mentioned above thereby to measure the flexural strength and flexural modulus of the test samples at 240° C.

(3) Thermal expansion coefficient:

Test pieces (about 4 mm×4 mm×18 mm) of each epoxy resin composition were prepared in the same manner as in the case of the above bending tests. Then, the extension of each test piece was measured by raising the temperature of test piece from room temperature at a rate of 5° C./min. while applying a load of 3 g to the test piece.

(4) Glass transition temperature:

Each epoxy resin composition was subjected to DMS measurement and the glass transition temperature thereof was determined from changes in tan δ.

(5) Length of burr:

Molded bodies of each epoxy resin composition were prepared by way of transfer molding at a molding pressure of 12 MPa by making use of a mold provided with slits of 5, 10, 20 and 40 μm. Then, the length of burrs formed on the molded bodies were measured.

(6) Adhesive strength epoxy resin composition to lead frame:

Cubic bodies (2 mm×2 mm×2 mm) of each epoxy resin composition were formed on a 42 alloy plate (0.3 mm in thickness) by way of transfer molding under the molding conditions of 180° C. and one minute to prepare test pieces. Each test piece was then tested to measure the adhesive strength under shear between the resin composition and the 42 alloy.

(7) The number of voids:

First of all, a package (40 mm×40 mm×3.6 mm) of each epoxy resin composition was formed by way of transfer molding. Then, the 40 mm×40 mm plane of the package thus obtained was abraded by making use of a sander, and the number of voids having a diameter larger than 0.1 mm was counted at every moment when the plane was reduced by a thickness of 0.3 mm. The counting of the number of voids was repeated four times, and the total number of the voids was calculated.

(8) Reflow cracking resistance:

First of all, each epoxy resin composition was employed to encapsulate a sample device (a chip having a dimension of 10 mm×18 mm), thus manufacturing a package (13 mm×22 mm×1.5 mm), which was then post-cured at a temperature of 175° C. over a period of 8 hours. Then, the resultant package was left to stand in an atmosphere of 85% in relative humidity and 85° C. in temperature for 168 hours, thus performing a moisture absorption treatment. Then, the package was subjected to an infra-red reflow treatment at a temperature of 240° C. to investigate the generation of cracks.

(9) Moisture resistance reliability:

The same type of package as employed for investigating the reflow cracking resistance as illustrated above was manufactured. Then, the package was subjected to a post-curing, a moisture absorption and a reflow treatment under the same conditions as in the case of the reflow cracking resistance test. Then, the resultant package was left to stand in an atmosphere of saturated water vapor at a temperature of 127° C. to investigate the fraction defective (defective due to leakage and defective due to opening), thus evaluating the moisture resistance.

(10) Thermal shock resistance:

Each epoxy resin composition was employed to encapsulate a semiconductor chip (15 mm×15 mm) of large size for a thermal shock resistance test, thus manufacturing a package. Then, the package was subjected to a post-curing, a moisture absorption and a reflow treatment under the same conditions as in the case of the reflow cracking resistance test. Each of the resin-encapsulated semiconductor devices was then subjected to a thermal shock cycle, one cycle thereof being consisted of −65° C. (30 minutes)/room temperature (5 minutes)/150° C. (30 minutes)/room temperature (5 minutes). This cycle was repeated 50 to 400 times to determine the fraction defective by checking the performance characteristics of the device.

The results of these tests are summarized in Tables 5 to 12 shown below.

TABLE 5

|  | Examples | | | | |
| --- | --- | --- | --- | --- | --- |
|  | I-1 | I-2 | I-3 | I-4 | I-5 |
| Melt viscosity [Pa · s] | | | | | |
| 10 kg loading | 25 | 23 | 22 | 24 | 21 |
| 40 kg loading | 20 | 18 | 17 | 17 | 16 |
| 80 kg loading | 16 | 14 | 14 | 13 | 12 |
| Bending strength (room temp.) [MPa] | 156 | 160 | 159 | 162 | 163 |
| Bending strength (240° C.) [MPa] | 19 | 20 | 22 | 21 | 20 |
| Thermal expansion coefficient [×10$^{-5}$1/° C.] | 0.8 | 0.8 | 0.8 | 0.8 | 0.8 |
| Glass transition temp. [° C.] | 110 | 111 | 109 | 110 | 102 |
| Length of burr [mm] | | | | | |
| 5 μm | 0.5 | 0.4 | 0.5 | 0.6 | 0.5 |
| 10 μm | 0.5 | 0.5 | 0.6 | 0.6 | 0.5 |
| 20 μm | 0.8 | 0.9 | 0.8 | 0.7 | 0.6 |
| 40 μm | 0.8 | 0.8 | 0.8 | 1.0 | 0.8 |
| Adhesion to lead frame material [MPa] | 15 | 17 | 18 | 14 | 17 |

|  | Examples | | | | |
| --- | --- | --- | --- | --- | --- |
|  | I-6 | I-7 | I-8 | I-9 | I-10 |
| Melt viscosity [Pa · s] | | | | | |
| 10 kg loading | 22 | 24 | 23 | 23 | 23 |
| 40 kg loading | 15 | 16 | 15 | 16 | 16 |
| 80 kg loading | 11 | 13 | 12 | 11 | 11 |
| Bending strength (room temp.) [MPa] | 162 | 155 | 159 | 158 | 158 |
| Bending strength (240° C.) [MPa] | 19 | 21 | 23 | 24 | 24 |
| Thermal expansion coefficient [×10$^{-5}$1/° C.] | 0.8 | 0.8 | 0.8 | 0.8 | 0.8 |
| Glass transition temp. [° C.] | 112 | 117 | 110 | 115 | 115 |
| Length of burr [mm] | | | | | |
| 5 μm | 0.3 | 0.5 | 0.5 | 0.6 | 0.6 |
| 10 μm | 0.5 | 0.5 | 0.7 | 0.6 | 0.6 |
| 20 μm | 0.7 | 0.8 | 0.7 | 0.8 | 0.8 |
| 40 μm | 0.7 | 0.9 | 1.0 | 0.9 | 0.9 |
| Adhesion to lead frame material [MPa] | 19 | 16 | 17 | 17 | 17 |

TABLE 6

|  | Comparative example | | | | | |
| --- | --- | --- | --- | --- | --- | --- |
|  | I-1 | I-2 | I-3 | I-4 | I-5 | I-6 |
| Melt viscosity [Pa · s] | | | | | | |
| 10 kg loading | 34 | 40 | 60 | 33 | 58 | 27 |
| 40 kg loading | 37 | 42 | 72 | 34 | 63 | 25 |
| 80 kg loading | 40 | 50 | 80 | 32 | 70 | 24 |
| Bending strength (room temp.) [MPa] | 155 | 160 | 162 | 158 | 163 | 160 |
| Bending strength (240° C.) [MPa] | 21 | 23 | 20 | 24 | 22 | 21 |
| Thermal expansion coefficient [×10$^{-5}$1/° C.] | 0.7 | 0.8 | 0.8 | 0.8 | 0.8 | 0.8 |

TABLE 6-continued

|  | Comparative example | | | | | |
| --- | --- | --- | --- | --- | --- | --- |
|  | I-1 | I-2 | I-3 | I-4 | I-5 | I-6 |
| Glass transition temp. [° C.] | 110 | 110 | 111 | 109 | 110 | 108 |
| Length of burr [mm] | | | | | | |
| 5 μm | 0.8 | 0.5 | 0.5 | 1.0 | 0.3 | 1.2 |
| 10 μm | 0.9 | 0.6 | 0.5 | 2.0 | 0.4 | 2.2 |
| 20 μm | 1.2 | 0.8 | 0.6 | 3.2 | 0.5 | 3.8 |
| 40 μm | 2.0 | 0.9 | 0.6 | 4.0 | 0.6 | 5.0 |
| Adhesion to lead frame material [MPa] | 10 | 7 | 8 | 11 | 6 | 12 |

TABLE 7

|  | Comparative example | | | | |
| --- | --- | --- | --- | --- | --- |
|  | I-7 | I-8 | I-9 | I-10 | I-11 |
| Melt viscosity [Pa · s] | | | | | |
| 10 kg loading | 38 | 22 | 24 | 50 | 52 |
| 40 kg loading | 36 | 20 | 22 | 48 | 49 |
| 80 kg loading | 32 | 19 | 20 | 45 | 47 |
| Bending strength (room temp.) [MPa] | 164 | 155 | 152 | 157 | 156 |
| Bending strength (240° C). [MPa] | 21 | 21 | 23 | 22 | 25 |
| Thermal expansion coefficient [×10$^{-5}$1/° C.] | 0.8 | 0.8 | 0.8 | 0.8 | 0.8 |
| Glass transition temp. [° C.] | 109 | 110 | 109 | 110 | 109 |
| Length of burr [mm] | | | | | |
| 5 μm | 0.8 | 1.0 | 1.2 | 0.6 | 0.7 |
| 10 μm | 1.0 | 2.5 | 2.2 | 0.7 | 0.7 |
| 20 μm | 1.2 | 3.3 | 4.0 | 0.8 | 0.8 |
| 40 μm | 1.8 | 5.3 | 4.9 | 1.0 | 1.0 |
| Adhesion to lead frame material [MPa] | 10 | 12 | 11 | 7 | 9 |

TABLE 8

|  | Reference example | | | | | |
| --- | --- | --- | --- | --- | --- | --- |
|  | I-1 | I-2 | I-3 | I-4 | I-5 | I-6 |
| Melt viscosity [Pa · s] | | | | | | |
| 10 kg loading | 35 | 40 | 37 | 26 | 60 | 55 |
| 40 kg loading | 33 | 41 | 38 | 25 | 55 | 52 |
| 80 kg loading | 32 | 38 | 40 | 23 | 53 | 48 |
| Bending strength (room temp.) [MPa] | 156 | 163 | 160 | 158 | 148 | 151 |
| Bending strength (240° C.) [MPa] | 24 | 20 | 18 | 20 | 18 | 24 |
| Thermal expansion coefficient [×10$^{-5}$1/° C.] | 0.7 | 0.8 | 0.8 | 0.8 | 0.8 | 0.8 |
| Glass transition temp. [° C.] | 110 | 110 | 109 | 109 | 111 | 108 |
| Length of burr [mm] | | | | | | |
| 5 μm | 1.0 | 0.5 | 0.5 | 1.1 | 0.4 | 0.5 |
| 10 μm | 1.2 | 0.6 | 0.5 | 2.5 | 0.4 | 0.5 |
| 20 μm | 1.5 | 0.6 | 0.6 | 3.7 | 0.6 | 0.7 |
| 40 μm | 2.0 | 0.8 | 0.8 | 4.5 | 0.7 | 0.9 |
| Adhesion to lead frame material [MPa] | 11 | 11 | 8 | 11 | 8 | 8 |

TABLE 9

| | Examples | | | | | | | | | |
|---|---|---|---|---|---|---|---|---|---|---|
| | I-1 | I-2 | I-3 | I-4 | I-5 | I-6 | I-7 | I-8 | I-9 | I-10 |
| Number of void | 3 | 6 | 3 | 4 | 5 | 7 | 2 | 8 | 4 | 4 |
| Reflow cracking resistance Cracking | 0/20 | 0/20 | 0/20 | 0/20 | 0/20 | 0/20 | 0/20 | 0/20 | 0/20 | 0/20 |
| Moisture resistance reliability | | | | | | | | | | |
| 100 hours | 0/20 | 0/20 | 0/20 | 0/20 | 0/20 | 0/20 | 0/20 | 0/20 | 0/20 | 0/20 |
| 200 hours | 0/20 | 0/20 | 0/20 | 0/20 | 0/20 | 0/20 | 0/20 | 0/20 | 0/20 | 0/20 |
| 300 hours | 0/20 | 0/20 | 0/20 | 0/20 | 0/20 | 0/20 | 0/20 | 0/20 | 0/20 | 0/20 |
| 400 hours | 0/20 | 1/20 | 0/20 | 0/20 | 0/20 | 0/20 | 0/20 | 0/20 | 0/20 | 0/20 |
| 500 hours | 0/20 | 1/20 | 1/20 | 0/20 | 0/20 | 0/20 | 1/20 | 0/20 | 0/20 | 0/20 |
| Thermal shock resistance | | | | | | | | | | |
| 50 cycle | 0/20 | 0/20 | 0/20 | 0/20 | 0/20 | 0/20 | 0/20 | 0/20 | 0/20 | 0/20 |
| 100 cycle | 0/20 | 0/20 | 0/20 | 0/20 | 0/20 | 0/20 | 0/20 | 0/20 | 0/20 | 0/20 |
| 200 cycle | 0/20 | 0/20 | 0/20 | 0/20 | 0/20 | 0/20 | 0/20 | 0/20 | 0/20 | 0/20 |
| 300 cycle | 0/20 | 0/20 | 0/20 | 0/20 | 0/20 | 0/20 | 0/20 | 0/20 | 0/20 | 0/20 |
| 400 cycle | 0/20 | 0/20 | 0/20 | 0/20 | 0/20 | 0/20 | 0/20 | 0/20 | 0/20 | 0/20 |

TABLE 10

| | Comparative Example | | | | | |
|---|---|---|---|---|---|---|
| | I-1 | I-2 | I-3 | I-4 | I-5 | I-6 |
| Number of void | 30 | 46 | 52 | 70 | 29 | 30 |
| Reflow cracking resistance Cracking | 2/20 | 1/20 | 1/20 | 2/20 | 1/20 | 1/20 |
| Moisture resistance reliability | | | | | | |
| 100 hours | 0/20 | 0/20 | 0/20 | 0/20 | 0/20 | 0/20 |
| 200 hours | 0/20 | 1/20 | 0/20 | 0/20 | 2/20 | 0/20 |
| 300 hours | 1/20 | 1/20 | 1/20 | 1/20 | 2/20 | 1/20 |
| 400 hours | 3/20 | 2/20 | 3/20 | 2/20 | 3/20 | 1/20 |
| 500 hours | 3/20 | 3/20 | 5/20 | 2/20 | 3/20 | 2/20 |
| Thermal shock resistance | | | | | | |
| 50 cycle | 0/20 | 0/20 | 0/20 | 0/20 | 0/20 | 0/20 |
| 100 cycle | 0/20 | 0/20 | 0/20 | 0/20 | 0/20 | 0/20 |
| 200 cycle | 0/20 | 0/20 | 0/20 | 0/20 | 0/20 | 0/20 |
| 300 cycle | 0/20 | 1/20 | 0/20 | 0/20 | 0/20 | 1/20 |
| 400 cycle | 1/20 | 2/20 | 1/20 | 1/20 | 1/20 | 3/20 |

TABLE 11

| | Comparative Example | | | | |
|---|---|---|---|---|---|
| | I-7 | I-8 | I-9 | I-10 | I-11 |
| Number of void | 67 | 55 | 59 | 40 | 56 |
| Reflow cracking resistance Cracking | 1/20 | 2/20 | 3/20 | 4/20 | 5/20 |
| Moisture resistance reliability | | | | | |
| 100 hours | 0/20 | 0/20 | 0/20 | 0/20 | 0/20 |
| 200 hours | 0/20 | 0/20 | 0/20 | 0/20 | 0/20 |
| 300 hours | 1/20 | 1/20 | 0/20 | 0/20 | 1/20 |
| 400 hours | 2/20 | 2/20 | 1/20 | 2/20 | 2/20 |
| 500 hours | 2/20 | 3/20 | 3/20 | 4/20 | 5/20 |
| Thermal shock resistance | | | | | |
| 50 cycle | 0/20 | 0/20 | 0/20 | 0/20 | 0/20 |
| 100 cycle | 0/20 | 0/20 | 0/20 | 0/20 | 0/20 |
| 200 cycle | 0/20 | 0/20 | 0/20 | 0/20 | 0/20 |
| 300 cycle | 0/20 | 1/20 | 2/20 | 0/20 | 1/20 |
| 400 cycle | 1/20 | 2/20 | 3/20 | 3/20 | 4/20 |

TABLE 12

| | Reference example | | | | | |
|---|---|---|---|---|---|---|
| | I-1 | I-2 | I-3 | I-4 | I-5 | I-6 |
| Number of void | 49 | 38 | 48 | 28 | 50 | 49 |
| Reflow cracking resistance Cracking | 3/20 | 2/20 | 1/20 | 1/20 | 1/20 | 3/20 |
| Moisture resistance reliability | | | | | | |
| 100 hours | 0/20 | 0/20 | 0/20 | 0/20 | 0/20 | 0/20 |
| 200 hours | 1/20 | 0/20 | 0/20 | 0/20 | 0/20 | 1/20 |
| 300 hours | 1/20 | 2/20 | 1/20 | 1/20 | 1/20 | 1/20 |
| 400 hours | 2/20 | 2/20 | 2/20 | 2/20 | 2/20 | 2/20 |
| 500 hours | 3/20 | 4/20 | 3/20 | 3/20 | 3/20 | 3/20 |
| Thermal shock resistance | | | | | | |
| 50 cycle | 0/20 | 0/20 | 0/20 | 0/20 | 0/20 | 0/20 |
| 100 cycle | 0/20 | 0/20 | 0t20 | 0/20 | 0/20 | 0/20 |
| 200 cycle | 0/20 | 0/20 | 0/20 | 0/20 | 0/20 | 0/20 |
| 300 cycle | 0/20 | 0/20 | 2/20 | 1/20 | 2/20 | 1/20 |
| 400 cycle | 2/20 | 1/20 | 4/20 | 4/20 | 4/20 | 2/20 |

As clearly seen from Table 5, the melt viscosity of the epoxy resin compositions of this invention (Examples (I-1) to (I-10)) was 25 Pa·S at most, and the length of burr formed on the molded products of each of these epoxy resin compositions was 1.0 mm or less. By contrast, the melt viscosity of the epoxy resin compositions of Comparative Examples (I-1) to (I-5), (I-7), (I-10) to (I-11) was relatively high though the generation of burr is not so conspicuous. Further, the epoxy resin compositions of other Comparative Examples exhibited the generation of long burr though the melt viscosity thereof was relatively low. Therefore, it is impossible in the case of the epoxy resin compositions of Comparative Examples to simultaneously attain both of the suitable melt viscosity of the resin composition and the reduction of burr on molded product. It would be clear therefore that only when three kinds of silica powder each differing in particle diameter from others are incorporated in the resin composition, it is possible, in spite of low melt viscosity thereof, to minimize the generation of burr on a molded product, and at the same time, to obtain a resin composition which is excellent in adhesion with a lead frame.

It would be clear from the resin compositions of Reference Examples shown in Table 8 that there is a preferable range with respect to the mixing ratio among three kinds of silica powder.

The resin layers which were obtained through the curing of the epoxy resin compositions of this invention (Examples (I-1) to (I-10)) having the aforementioned characteristics were minimal in generation of void, i.e. 5 or less in most cases as shown in Table 9. Furthermore, the resin-encapsulated semiconductor devices which were encapsulated with the resin compositions of this invention were almost free from defective even when they were tested for reflow cracking resistance, moisture resistance reliability and thermal shock resistance. On the other hand, as shown in Tables 10 and 11, a large number of voids were recognized in the resin layers which were obtained through the curing of resin compositions of Comparative Examples. In particular, in the case of Comparative Example (I-7), the number of voids was found to be as much as 70. Furthermore, the resin-encapsulated semiconductor devices which were encapsulated with the resin compositions of Comparative Examples were found to be accompanied with cracks, thus certainly generating defectives in the tests of moisture resistance reliability and thermal shock resistance.

As explained above, it is possible according to this invention to obtain an epoxy resin composition which is not only excellent in melt properties but also capable of manufacturing a molded body which is almost free from burr. In addition to these characteristics, the resin composition of this invention is also excellent in adhesion with a lead frame, so that it is possible, by employing the resin composition of this invention for the encapsulation of an semiconductor element, to obtain a resin-encapsulated semiconductor device which is excellent in reflow cracking resistance, moisture resistance reliability and thermal shock resistance.

EXAMPLE II

In this example, the surface of the powder of an epoxy resin composition was allowed to be covered by inorganic fine particles, thus preparing an epoxy resin molding material. Then, this epoxy resin molding material was employed for encapsulating a semiconductor element, thus manufacturing a resin-encapsulated semiconductor device.

The components contained in the epoxy resin composition of this Example are as follows.
(Epoxy resin)
(II-A): bishydroxybiphenyl type epoxy resin (YL-6121H, Yuka Shell Epoxy Kabushikikaisha, epoxy equivalent: 170)
(II-B): dihydroxydiphenyl methane type epoxy resin (ESLV-80XY, Nippon Steel Chemical Co., Ltd., epoxy equivalent: 196)
(Curing agent)
(II-A): phenol novolak resin (BRG-556, Showa High Polymer Co., Ltd., hydroxyl equivalent: 104)
(II-B): phenol aralkyl resin (XL-225-4L, Mitsui Toatsu Co., Ltd., hydroxyl equivalent: 175)
(Other components)
 Curing accelerator II: triphenyl phosphine
 Releasing agent II: ester type wax
 Pigment II: carbon black
 Silane coupling agent II: y-glycidoxypropyl trimethoxysilane
(Inorganic filler)
Fused silica (silica powder of the same kind as employed in Example (I-1))
(Inorganic fine particle)
A: Fused silica (average particle diameter 0.5 μm, Tatsumori Co., Ltd., SO-25H)
B: Alumina (average particle diameter 0.6 μm, Tatsumori Co., Ltd., AO-504)
C: Silica fine particle (average particle diameter 0.012 μm, Nippon Aerosil Co., Ltd., Aerosil 200)
D: Silica fine particle (average particle diameter 0.04 μm, Nippon Aerosil Co., Ltd., Aerosil OX-50)
E: Silica fine particle (average particle diameter 0.016 μm, Nippon Aerosil Co., Ltd., Aerosil R972)
F: Fused silica (average particle diameter 2 μm, Denki Kagaku Kogyo K.K., FB-01)
(Organic fine particle)
Fine particles of ester type wax (average particle diameter 0.9 μm)

These components were mixed together according to the formulations shown in the following Tables 13 and 14 to prepare the epoxy resin compositions of Examples (II-1) to (II-9) and Comparative Examples (II-1) to (II-5). The mixing amounts shown in Tables 13 and 14 are based on weight parts.

TABLE 13

| | Examples | | | | | | | | |
|---|---|---|---|---|---|---|---|---|---|
| | II-1 | II-2 | II-3 | II-4 | II-5 | II-6 | II-7 | II-8 | II-9[a] |
| Epoxy resin II-A | 5.7 | — | 4.55 | — | 5.7 | — | 4.55 | — | — |
| Epoxy resin II-B | — | 6.0 | — | 5.0 | — | 6.0 | — | 0.5 | 5.0 |
| Curing agent II-A | 3.35 | 3.05 | — | — | 3.35 | 3.05 | — | — | — |
| Curing agent II-B | — | — | 4.5 | 4.05 | — | — | 4.5 | 4.05 | 4.05 |
| Cure accelerator II | 0.15 | 0.15 | 0.15 | 0.15 | 0.15 | 0.15 | 0.15 | 0.15 | 0.15 |
| Releasing agent II | 0.2 | 0.2 | 0.2 | 0.2 | 0.2 | 0.2 | 0.2 | 0.2 | 0.2 |
| Pigment II | 0.3 | 0.3 | 0.3 | 0.3 | 0.3 | 0.3 | 0.3 | 0.3 | 0.3 |
| Silane coupling agent II | 0.3 | 0.3 | 0.3 | 0.3 | 0.3 | 0.3 | 0.3 | 0.3 | 0.3 |
| Inorganic filler | 90 | 90 | 90 | 90 | 90 | 90 | 90 | 90 | 90 |
| Inorganic fine particles A | 0.5 | — | — | — | — | — | — | — | — |
| Inorganic fine particles B | — | 0.5 | — | — | — | — | — | — | — |
| Inorganic fine particles C | — | — | 0.2 | — | — | 0.2 | — | — | 0.2 |
| Inorganic fine particles D | — | — | — | 0.2 | — | — | — | 1.2 | — |
| Inorganic fine particles E | — | — | — | — | 0.2 | — | 0.2 | — | — |
| Inorganic fine particles F | — | — | — | — | — | — | — | — | — |

TABLE 13-continued

| | Examples | | | | | | | | |
|---|---|---|---|---|---|---|---|---|---|
| | II-1 | II-2 | II-3 | II-4 | II-5 | II-6 | II-7 | II-8 | II-9[a] |
| Organic fine particles | — | — | — | — | — | — | — | — | — |
| Manufacturing method of molding material | A | A | A | A | A | B | B | B | A |

A: High speed Henshel mixer;
B: Impact grinder;
[a]Granular powder

TABLE 14

| | Examples | | | | |
|---|---|---|---|---|---|
| | II-1 | II-2 | II-3 | II-4 | II-5[b] |
| Epoxy resin II-A | 5.7 | — | 4.55 | — | — |
| Epoxy resin II-B | — | 6.0 | — | 5.0 | 5.0 |
| Curing agent II-A | 3.35 | 3.05 | — | — | — |
| Curing agent II-B | — | — | 4.5 | 4.05 | 4.05 |
| Cure accelerator II | 0.15 | 0.15 | 0.15 | 0.15 | 0.15 |
| Releasing agent II | 0.2 | 0.2 | 0.2 | 0.2 | 0.2 |
| Pigment II | 0.3 | 0.3 | 0.3 | 0.3 | 0.3 |
| Silane coupling agent II | 0.3 | 0.3 | 0.3 | 0.3 | 0.3 |
| Inorganic filler | 90 | 90 | 90 | 90 | 90 |
| Inorganic fine particles A | — | — | — | — | — |
| Inorganic fine particles B | — | — | — | — | — |
| Inorganic fine particles C | — | — | — | — | — |
| Inorganic fine particles D | — | — | — | 0.2 | — |
| Inorganic fine particles E | — | — | — | — | — |
| Inorganic fine pariicles F | — | 0.5 | — | — | — |
| Organic fine particles | — | — | 0.5 | — | — |
| Manufacturing method of molding material | — | A | A | C | — |

A: High speed Henshel mixer;
C: Twin-cylinder mixer;
[b]Granular powder

These epoxy resin compositions were prepared as follows. First of all, the inorganic filler was surface-treated by making use of a silane coupling agent in a Henschel mixer. Then, all components, other than the inorganic fine particle and the organic fine particle, were mixed together and then kneaded by means of hot rolls at a temperature of 60 to 130° C. to obtain a mixture. Then, the resultant mixture was cooled and pulverized to obtain an epoxy resin composition. In this case, the epoxy resin compositions of Examples (II-1) to (II-5) and Comparative Examples (II-1) to (II-4) were pulverized to have a particle diameter of 1 mm or less, while the epoxy resin compositions of Examples (II-6) to (II-8) were pulverized to have a particle diameter of 3 mm or less. The epoxy resin compositions of Example (II-9) and Comparative Example (II-5) were melt-kneaded by means of double-screw extruder at first and then cut into pieces by means of pelletizer to obtain granular resin powder. The resultant resin powder was 2 mm in average particle diameter and contained 1 wt. % (based on the entire powder) of particle having a diameter of 0.1 mm or less.

Then, the resin powder of the epoxy resin composition and a predetermined quantity of inorganic or organic fine particles were charged into a twin-cylinder mixer and mixed together at room temperature and at a rotational speed of 15 rpm for 20 minutes to obtain a mixture. Subsequently, the mixture was subjected to a mechanical impact-giving treatment thereby to obtain an epoxy resin molding material wherein the surface of resin powder of the epoxy resin composition was covered by the fine particles. The mechanical impact-giving treatment in this case was performed by subjecting the mixture to a high-speed mixing treatment at a rotational speed of 4,000 rpm by making use of a Henschel mixer in the cases of Examples (II-1) to (II-5) and Comparative Examples (II-2) and (II-3), while in the cases of Examples (II-6) to (II-8), the mixture was pulverized by making use of an impact grinder thereby obtaining powder having particle diameter of 1 mm or less.

On the other hand, in the cases of Comparative Examples (II-1) and (II-5), the epoxy resin composition was employed as it was without covering the resin powder with the fine particles, while in the case of Comparative Examples (II-4), the mixture comprising the epoxy resin composition powder and the inorganic fine particles was employed as it was without subjecting the mixture to a mechanical impact-giving treatment.

Then, 14 kinds of the epoxy resin compositions, i.e. Examples (II-1) to (II-9) and Comparative Examples (II-1) to (II-5) were subjected to the following evaluation tests.

(1) Blocking property:

The powder of each epoxy resin molding material was sampled in a container and left to stand in a thermostatic chamber for 24 hours at a temperature of 30° C. Then, the resin powder was observed to see if it was blocked or not.

(2) The density of resin tablet:

35 g of the powder of each epoxy resin molding material was compressed to mold a resin tablet having an outer diameter of 30 mm. Then, the apparent specific gravity of the resin tablet was calculated based on the overall size and weight of the resin tablet, whereby determining the density of the resin tablet. This density of resin tablet represents the ratio (%) of the apparent specific gravity of the resin tablet to the specific gravity of the cured product of the epoxy resin molding material.

(3) Fluidity:

The melt viscosity of each epoxy resin molding material at a temperature of 180° C. was measured by making use of a flow tester.

(4) Water absorption:

Test pieces (30 mm×30 mm×1 mm) of each epoxy resin molding material were prepared by way of a low pressure transfer molding under the conditions of 180° C. and 60 seconds, and by post-curing the resultant molded pieces over a period of 8 hours at a temperature of 180° C. This test piece was then left to stand in an atmosphere of 85% in relative humidity and 85° C. in temperature for 168 hours, thus measuring the moisture absorption thereof.

(5) Evaluation of reliability of a semiconductor device:

First of all, each epoxy resin molding material was employed to encapsulate a sample semiconductor element (a chip having a dimension of 15 mm×15 mm), thus manufacturing a sample of resin-encapsulated semiconductor device. In the case of Examples (II-1) to (II-8) and Comparative Examples (II-1) to (II-4), the tablet was employed. In the case of Example (II-9) and Comparative Example (II-5), the resin powder was employed as it was.

The external appearance of the package of resin-encapsulated semiconductor device was then visually investigated to determine the rate of any defective molding such as external void.

Then, the package of resin-encapsulated semi-conductor device was left to stand in an atmosphere of 85% in relative humidity and 85° C. in temperature for 72 hours, thus performing a moisture absorption treatment. Then, the package was subjected to an infra-red reflow treatment at a temperature of 240° C. to investigate the generation ratio of reflow cracks thereof, thereby evaluating the solder reflow resistance of the package.

Furthermore, these resin-encapsulated semiconductor devices were evaluated with respect to the moisture resistance reliability by way of a pressure cooker test (PCT test). Specifically, the semiconductor device was left to stand in an atmosphere of saturated water vapor at a temperature of 127° C. under a pressure of 2.5 atm. to investigate the fraction defective (defective due to leakage and defective due to opening), thus evaluating the moisture resistance reliability.

The results of these evaluations are shown in the following Tables 15 and 16.

TABLE 15

|  | Examples | | | | | | | | |
| --- | --- | --- | --- | --- | --- | --- | --- | --- | --- |
|  | II-1 | II-2 | II-3 | II-4 | II-5 | II-6 | II-7 | II-8 | II-9 |
| Blocking | None | None | None | None | None | None | None | None | None |
| Density of tablet (%) | 95.5 | 95.2 | 95.0 | 95.3 | 95.7 | 95.5 | 95.2 | 95.0 | 95.1 |
| Melt viscosity (Pa · s) | 18 | 19 | 19 | 20 | 19 | 20 | 19 | 25 | 20 |
| Water absorbency (wt %) | 0.22 | 0.20 | 0.21 | 0.18 | 0.22 | 0.21 | 0.21 | 0.23 | 0.20 |
| Visual inspection | 0/20 | 0/20 | 0/20 | 0/20 | 0/20 | 0/20 | 0/20 | 0/20 | 0/20 |
| Solder reflow resistance | 0/20 | 0/20 | 0/20 | 0/20 | 0/20 | 0/20 | 0/20 | 1/20 | 0/20 |
| PCT test |  |  |  |  |  |  |  |  |  |
| 50 hours | 0/20 | 0/20 | 0/20 | 0/20 | 0/20 | 0/20 | 0/20 | 0/20 | 0/20 |
| 100 hours | 0/20 | 0/20 | 0/20 | 0/20 | 0/20 | 0/20 | 0/20 | 0/20 | 0/20 |
| 250 hours | 0/20 | 0/20 | 0/20 | 0/20 | 0/20 | 0/20 | 0/20 | 0/20 | 0/20 |
| 400 hours | 0/20 | 0/20 | 0/20 | 0/20 | 0/20 | 0/20 | 0/20 | 0/20 | 0/20 |
| 500 hours | 0/20 | 0/20 | 0/20 | 0/20 | 0/20 | 0/20 | 0/20 | 1/20 | 0/20 |

TABLE 16

|  | Comparative Example | | | | |
| --- | --- | --- | --- | --- | --- |
|  | II-1 | II-2 | II-3 | II-4 | II-5 |
| Blocking | Admitted | Admitted | None | Admitted | Admitted |
| Density of tablet (%) | 91.0 | 92.2 | 95.0 | 92.8 | 92.0 |
| Melt viscosity (Pa · s) | 25 | 26 | 20 | 26 | 22 |
| Water absorbency (wt %) | 0.24 | 0.24 | 0.30 | 0.23 | 0.23 |
| Visual inspection | 15/20 | 7/20 | 0/20 | 10/20 | 16/20 |
| Solder reflow resistance | 8/20 | 6/20 | 10/20 | 5/20 | 6/20 |
| PCT test |  |  |  |  |  |
| 50 hours | 0/20 | 0/20 | 0/20 | 0/20 | 0/20 |
| 100 hours | 0/20 | 0/20 | 0/20 | 0/20 | 0/20 |
| 250 hours | 0/20 | 0/20 | 1/20 | 0/20 | 1/20 |
| 400 hours | 2/20 | 1/20 | 5/20 | 1/20 | 4/20 |
| 500 hours | 5/20 | 3/20 | 9/20 | 2/20 | 6/20 |

As shown in Table 15, the epoxy resin molding materials of this invention (Examples (II-1) to (II-9)) were free from the blocking of resin powder, thus making it possible to realize an excellent workability at the occasion of forming the tablet, to obtain a resin tablet having a high density, and to manufacture a resin-encapsulated semiconductor device which is free from defective molding such as the generation of void.

Further, the semiconductor device encapsulated by making use of these epoxy resin molding materials were not only almost free from the generation of defective molding, but also almost free from the generation of cracks in the process of reflow and from the generation of defective in the PCT test, thus exhibiting excellent solder reflow resistance and moisture resistance reliability.

By contrast, as shown in Table 16, the molding materials to which the inorganic fine particle was not added (Comparative Examples II-1 and II-5), the molding material which was covered by the inorganic fine particle having an average particle diameter of 2 μm (Comparative Example II-2), and the molding material wherein the inorganic fine particle was merely added to the resin powder without rendering the inorganic fine particles to sufficiently cover the surface of the resin powder (Comparative Example II-4) were all exhibited the blocking of resin powder, thus deteriorating the workability in the process of forming the tablet and hence failing to obtain a resin tablet having a high density. Further, the semiconductor devices encapsulated by making use of these molding materials exhibited a great degree of generation of defective molding such as an external void, and were found to be poor in solder reflow resistance and in moisture resistance reliability.

On the other hand, in the case of the molding material wherein an organic fine particle was substituted for the inorganic fine particle for covering the surface of the resin powder (Comparative Example II-3), the resultant cured product indicated a high water absorption, so that the semiconductor device manufactured using this molding material was found to be very poor in solder reflow resistance and in moisture resistance reliability as shown in Table 16.

Since the surface of the resin powder is covered by inorganic fine particles having a diameter of 1 μm or less in the epoxy resin molding material of this invention, it is possible to prevent the resin powder from blocking, to improve the workability in the process of manufacturing a tablet, and to obtain a resin tablet having a high density. Further, it is also possible, by encapsulating a semiconductor element by making use of the resin tablet or granule manufactured from the epoxy resin molding material of this invention, to obtain a resin-encapsulated semiconductor device which is free from void and excellent in quality.

Moreover, the resin-encapsulated semiconductor device of this invention wherein a semiconductor element is encapsulated by a cured body of such an epoxy resin molding material is not only almost free from the generation of defective molding, but also excellent solder reflow resistance and moisture resistance reliability.

EXAMPLE III

In this example, the surface of resin tablet comprising an epoxy resin composition was allowed to be covered by fine particles having a softening point or melting point which is higher than those of the epoxy resin composition, thus preparing an epoxy resin composite tablet. Then, this epoxy resin composite tablet was employed for encapsulating a semiconductor element, thus manufacturing a resin-encapsulated semiconductor device.

This resin composite tablet according to this invention will be explained with reference to drawings.

Figure 1B:
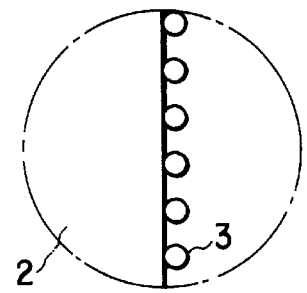
FIG. 1B is an enlarged view schematically illustrating a portion of the tablet shown in FIG. 1A.

Namely, FIG. 1A represents a schematic view of the epoxy resin composite tablet according to this invention, while FIG. 1B illustrates an enlarged view of a portion of the surface of this epoxy resin composite tablet. The main body 2 of the epoxy resin tablet is manufactured as follows. Namely, an epoxy resin, a curing agent, an inorganic filler and any additive(s) required are mixed together, kneaded and then pulverized to obtain a resin composition, which is then compression-molded to obtain the main body 2 of the epoxy resin tablet. The surface of the main body 2 of the epoxy resin tablet is covered as shown in FIG. 1B by fine particles 3 having a softening point or melting point which are higher than those of the epoxy resin composition.

Since the surface of this resin tablet is covered by specific fine particles (spacer particles) 3, even if a couple of the resin tablets for instance are left to stand under a condition where these tablets are superimposed one upon another, the main bodies 2 thereof would not be directly contacted with each other. Therefore, there is little possibility that the resin of low viscosity which is contained in the epoxy resin composition of one resin tablet would be adhered with the resin of low viscosity which is contained another resin tablet, thus making it possible to easily separate these resin tablets from each other.

This example will be further explained in detail with reference to the following specific examples.

First of all, epoxy resin compositions (TB-1 and TB-2) were prepared according to the formulations shown in the following Table 17 by means of the conventional method so as to manufacture the main bodies of resin tablets. The mixing quantities shown in Table 17 are based on weight parts.

TABLE 17

|  | TB-1 | TB-2 |
|---|---|---|
| Bisphenol F resin | 4.710 | 0 |
| Biphenyl resin | 0 | 4.710 |
| Phenolic resin | 3.88 | 3.88 |
| Catalyst | 0.15 | 0.15 |
| Releasing agent (wax) | 0.2 | 0.2 |
| Silicone modifying agent | 0.5 | 0.5 |
| Colorant | 0.2 | 0.2 |
| Quartz filler | 90.0 | 90.0 |
| Coupling agent | 0.42 | 0.42 |
| Antistatic agent | 0.005 | 0.005 |

Each epoxy resin composition was then kneaded, melted, solidified and pulverized by making use of a grinder to obtain a resin powder, which was then compression-molded to obtain a resin tablet 35 g in weight and 35 mm in outer diameter.

As for the spacer fine particles to cover the surface of the resin tablet, the following 11 kinds of fine particles shown in the following Table 18 were prepared.

TABLE 18

|  | Spacer particles | Features |
|---|---|---|
| SP-1 | Quartz filler | Average particle diameter 6 $\mu$m, Softening point 1500° C. |
| SP-2 | Polyfunctional epoxy resin composition | Weight ratio of silica particle 80%, Softening point 60° C. |
| SP-3 | Silicone ball | Average particle diameter 4.5 $\mu$m, Thermal cracking temp. 420° C. |
| SP-4 | Alcohol-based oxidized wax | Melting temp. 74° C. |
| SP-5 | Polyethylene | Vicat softening point 125° C. |
| SP-6 | Stearic alcohol | Melting temp. 59° C. |
| SP-7 | Polyethylene | Vicat softening point 56° C. |
| SP-8 | Lauric acid | Melting temp. 45° C. |
| SP-9 | Ethylene vinylacetate copolymer | Vicat softening point 42° C. |
| SP-10 | Quartz filler | Average particle diameter 50 $\mu$m, Softening point 1500° C. |
| SP-11 | Quartz filler | Average particle diameter 100 $\mu$m, Softening point 1500° C. |

The aforementioned resin tablet main bodies and spacer fine particles were respectively combined as shown in the following Table 19 to manufacture samples of resin composite tablets of Examples (III-1) to (III-11), Comparative Examples (III-1) to (III-4) and Reference Examples (III-1) and (III-2).

TABLE 19

|  |  | Tablet | Spacer particle |
|---|---|---|---|
| Examples | III-1 | TB-1 | SP-1 |
|  | III-2 | TB-1 | SP-2 |
|  | III-3 | TB-1 | SP-3 |
|  | III-4 | TB-1 | SP-4 |
|  | III-5 | TB-1 | SP-5 |
|  | III-6 | TB-2 | SP-1 |
|  | III-7 | TB-2 | SP-2 |
|  | III-8 | TB-2 | SP-3 |
|  | III-9 | TB-2 | SP-4 |
|  | III-10 | TB-2 | SP-5 |
|  | III-11 | TB-1 | SP-6 |
|  | III-12 | TB-1 | SP-7 |
| Comparative Example | III-1 | TB-1 | — |
|  | III-2 | TB-2 | — |
|  | III-3 | TB-1 | SP-8 |
|  | III-4 | TB-1 | SP-9 |
| Reference Example | III-1 | TB-1 | SP-10 |
|  | III-2 | TB-1 | SP-11 |

Figure 2A:
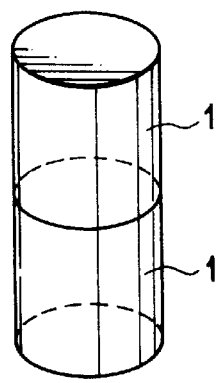
FIG. 2A is a perspective view schematically illustrating a state where a couple of epoxy resin composite tables according to this invention are adhered to each other.
Figure 2B:
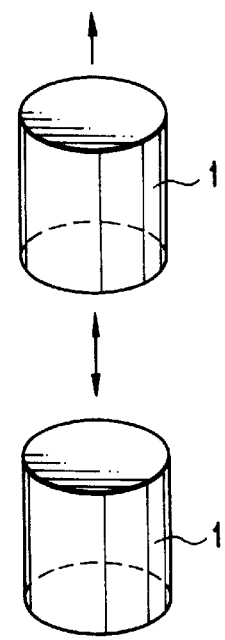
FIG. 2B is a perspective view schematically illustrating a state where the couple of epoxy resin composite tables shown in FIG. 2A are separated from each other.

The epoxy resin composite tablets manufactured in this manner were then evaluated with respect to the adhesivity thereof as follows. Namely, a couple of the samples of Example (III-1) were superimposed as shown in FIG. 2A and left to stand for 100 hours at a temperature of 35° C. When it is tried to separate these samples, they were easily separated from each other without generating a fracture of the tablet, i.e. these tablets were free from any damages.

Figure 3A:
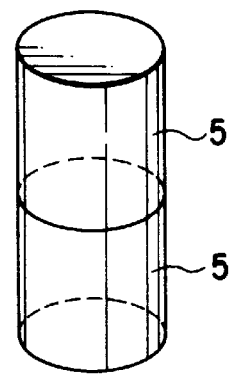
FIG. 3A is a perspective view schematically illustrating a state where a couple of epoxy resin composite tables according to a comparative example are adhered to each other.
Figure 3B:
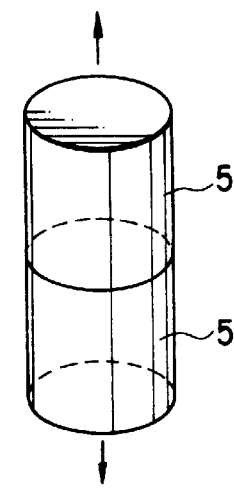
FIG. 3B is a perspective view schematically illustrating a state where the couple of epoxy resin composite tables shown in FIG. 3A are kept adhered with each other.

When the samples of Comparative Example (III-1) were superimposed in the same manner as described above, i.e. as shown in FIG. 3A and left to stand at a temperature of 35° C., the adhesion of these tablets was recognized after 15 hours, and the adhesion between these tablets became strong after 100 hours, so that it was impossible as illustrated in FIG. 3B to separate these tablets from each other with the force employed in the case of the aforementioned Example (III-1). When these tablets were forced to separate with a stronger force, a fracture was generated at the bonded portion of them.

The samples of Examples (III-2) to (III-5) were evaluated with respect to the adhesion thereof in the same manner as illustrated above, the results obtained being summarized in the following Table 20.

Further, when the aforementioned tests were conducted under more severe condition (40° C.), only the sample of Example (III-3) could be separated by its deadweight among five kinds of samples of Examples (III-1) to (III-5). The sample of Example (III-3) was consisted of resin powder, the surface of which was covered by silicone balls. Accordingly, it was found that the silicone balls were most effective in inhibiting the tablets from being adhered to each other.

Then, a resin-encapsulated semiconductor device was manufactured by making use of each of the epoxy resin composite tablets of this invention, and the resultant resin-encapsulated semiconductor device was evaluated of its reliability through a visual inspection and an electric property inspection. Namely, the tablet of each Example was left to stand for 24 hours at room temperature, and then employed for encapsulating (sealing) a test semiconductor chip (18 mm×18 mm) which had been assembled in a QFP184 pin frame thereby to manufacture a semiconductor device. The encapsulation was performed by making use of a mold which was exclusively designed for the QFP184 pin frame wherein the resin was molded using a transfer molding apparatus under the conditions of 185° C. and 60 seconds.

The external appearance of the resin-encapsulated semiconductor device thus obtained was evaluated through a visual inspection to investigate the ratio of defective molding.

In order to investigate the thermal shock =7 resistance of the resin-encapsulated semiconductor device, the following TCT test was performed. First of all, each resin-encapsulated semiconductor device was left to stand in an atmosphere of 85% in relative humidity and 85° C. in temperature for 72 hours, thus performing a moisture absorption treatment. Then, the resin-encapsulated semiconductor device was subjected to an infra-red reflow treatment at a temperature of 240° C. and to a thermal shock cycle, one cycle thereof being consisted of −65° C. (to 150° C. This cycle was repeated 100 to 500 times to determine the fraction defective by checking the performance characteristics of the semiconductor device.

Further, for the purpose of investigating the moisture resistance of the resin-encapsulated semiconductor device, the following PCT test was performed. First of all, each resin-encapsulated semiconductor device was left to stand in

TABLE 20

|  | Example III-1 | Example III-2 | Example III-3 | Example III-4 | Example III-5 | Comparative example III-1 |
|---|---|---|---|---|---|---|
| Initial stage | No trouble (adhesion is not found) | No trouble (adhesion is not found) | No trouble (adhesion is not found) | No trouble (adhesion is not found) | No trouble (adhesion is not found) | No trouble (adhesion is not found) |
| 35° C. After 15 hrs. | Separated by deadweight | Separated by deadweight | Separated by deadweight | Separated by deadweight | Separated by deadweight | Tablets are adhered |
| 35° C. After 100 hrs. | Separated by deadweight | Tablets are adhered | Separated by deadweight | Tablets are adhered | Separated by deadweight | Tablets are strongly adhered |
| Remarks | No trouble | No trouble | No trouble | No trouble | No trouble | Tablets are fractured when separated |

As shown in Table 20, since the epoxy resin composite tablets according to this invention were very weakly adhered with each other even if they were adhered to each other, they could be easily separated without causing the fracture or deformation thereof.

an atmosphere of 85% in relative humidity and 85° C. in temperature for 72 hours, thus performing a moisture absorption treatment. Then, the resin-encapsulated semiconductor device was subjected to an infra-red reflow treatment, and subsequently, the resultant package was left to stand in an atmosphere of saturated water vapor of 2.5 atm. at a temperature of 127° C. to investigate the fraction defective (defective due to leakage and defective due to opening), thus evaluating the moisture resistance.

The results of these evaluations are summarized in the following Table 21.

specific fine particles according to this invention was not only excellent in moldability, but also minimal in the ratio of generating defectives in electric inspections at PCT test and TCT test conducted after reflow treatment and hence excellent in reliability. These excellent properties may be attributed to the fact that the spacer particles functioned as

TABLE 21

| Inspection Items | Example III-1 | Example III-2 | Example III-3 | Example III-4 | Example III-5 | Comparative example III-1 |
|---|---|---|---|---|---|---|
| Visual inspection of package | 3/500 | 1/500 | 3/500 | 1/500 | 1/500 | 7/20 |
| Thermal shock resistance | | | | | | |
| Before TCT | 0/20 | 0/20 | 0/20 | 0/20 | 0/20 | 0/20 |
| 100 times | 0/20 | 0/20 | 0/20 | 0/20 | 0/20 | 0/20 |
| 200 times | 0/20 | 0/20 | 0/20 | 0/20 | 0/20 | 2/20 |
| 300 times | 0/20 | 0/20 | 0/20 | 0/20 | 0/20 | 2/20 |
| 400 times | 0/20 | 0/20 | 0/20 | 0/20 | 1/20 | 5/20 |
| 500 times | 0/20 | 0/20 | 1/20 | 0/20 | 2/20 | 5/20 |
| Moisture resistance reliability | | | | | | |
| Before PCT | 0/20 | 0/20 | 0/20 | 0/20 | 0/20 | 0/20 |
| 100 hours | 0/20 | 0/20 | 0/20 | 0/20 | 0/20 | 0/20 |
| 200 hours | 0/20 | 0/20 | 0/20 | 0/20 | 0/20 | 2/20 |
| 300 hours | 0/20 | 0/20 | 0/20 | 0/20 | 1/20 | 3/20 |
| 400 hours | 0/20 | 2/20 | 0/20 | 0/20 | 2/20 | 5/20 |
| 500 hours | 0/20 | 2/20 | 1/20 | 0/20 | 2/20 | 7/20 |

As shown in Table 21, the semiconductor devices which were encapsulated with the epoxy resin composite tablets of this invention (Examples (III-1) to (III-5)) were found to be extremely low in the ratio of defective molding resulted from voids, and also found to be quite rare regarding the generation of defectives in the TCT test and the PCT test. By contrast, in the case of the semiconductor devices which was encapsulated using the resin tablet of Comparative Example (III-1) where the surface of the tablet was not covered by fine particles, about 30% of the samples were observed as being defective molding. Moreover, in the TCT test of these samples, the generation of defective was recognized at the 200th cycle, and ¼ of the samples were found to be defective at the 500th cycle. In the PCT test of these samples also, the generation of defective was recognized at the 200th cycle, and 30% of the samples were found to be defective at the 500th cycle.

The fine particles consisting of an organic material such as a thermosetting resin composition, wax and thermoplastic resin are more excellent in affinity to the epoxy resin composition constituting the main body of tablet as compared with inorganic fine particles, so that the organic fine particles are advantageous in the following respects. Namely, since there is little possibility of generating a defective mode wherein the fine particles and the association thereof are detected as a foreign matter on the surface of the package and hence determined as a defective molding, the yield of the package can be improved. For example, it is indicated in the results shown in the aforementioned Table 18 that the ratio of generating a defective molding in the cases of Examples (III-1) and (III-3) where inorganic fine particles were employed as a spacer was 3/500, whereas the ratio of generating a defective molding in the cases of Examples (III-2), (III-4) and (III-5) where organic fine particles were employed as a spacer was 1/500.

It would be clear from the above explanations that the semiconductor device which was prepared by making use of the epoxy resin composite tablet covered on its surface with a barrier layer for preventing water from penetrating into the surface of the tablet.

Therefore, the spacer particles are also effective for use in preventing the generation of defective molding (due to the generation of voids) which may be brought about by the absorption of water by a resin constituting the tablet. This effect would become more prominent when the fine particles which have been surface-treated to make them hydrophobic are employed.

For example, when a package was manufactured by making use of the epoxy resin composite tablet of Example (III-1) and the volume of voids formed in the package was measured, the volume of voids per package was found to be 0.017 mm$^3$. By contrast, when a package was manufactured by making use of an epoxy resin composite tablet containing the same kind of quartz filler as employed in the above example except that the quartz filler was surface-treated in advance to make it hydrophobic and the volume of voids formed in the package was measured, the volume of voids per package was found decreased to 0.010 mm$^3$.

Next, the samples of Examples (III-6) to (III-10) and Comparative Example (III-6) were evaluated regarding the adhesivity in the same manner as mentioned above, the results being summarized in the following Table 22. By the way, the samples of Examples (III-6) to (III-10) and Comparative Example (III-6) were formed of the same kinds of resin tablet as employed in Examples (III-1) to (III-5) and Comparative Example (III-1) except that a biphenyl type resin was substituted for the bisphenol F type resin.

Further, QFP184 pin resin-encapsulated semiconductor devices which were prepared using these samples were evaluated through a visual inspection and determined regarding the reliability thereof, the results being summarized in the following Table 23.

TABLE 22

|  | Example III-6 | Example III-7 | Example II-8 | Example III-9 | Example III-10 | Comparative example III-2 |
|---|---|---|---|---|---|---|
| Initial stage | No trouble (adhesion is not found) | No trouble (adhesion is not found) | No trouble (adhesion is not found) | No trouble (adhesion is not found) | No trouble (adhesion is not found) | No trouble (adhesion is not found) |
| 35° C. After 15 hrs. | Separated by deadweight | Separated by deadweight | Separated by deadweight | Separated by deadweight | Separated by deadweight | Separated by deadweight |
| 35° C. After 100 hrs. | Separated by deadweight | Separated by deadweight | Separated by deadweight | Separated by deadweight | Separated by deadweight | Tablets are adhered |
| Remarks | No trouble | No trouble | No trouble | No trouble | No trouble | Tablets are fractured when separated |

TABLE 23

| Inspection Items | Example III-6 | Example III-7 | Example III-8 | Example III-9 | Example III-10 | Comparative example III-2 |
|---|---|---|---|---|---|---|
| Visual inspection of package | 0/20 | 0/20 | 0/20 | 0/20 | 0/20 | 3/20 |
| Thermal shock resistance |  |  |  |  |  |  |
| Before TCT | 0/20 | 0/20 | 0/20 | 0/20 | 0/20 | 0/20 |
| 100 times | 0/20 | 0/20 | 0/20 | 0/20 | 0120 | 1/20 |
| 200 times | 0/20 | 0120 | 0/20 | 0/20 | 0/20 | 2/20 |
| 300 times | 0/20 | 0/20 | 0/20 | 0/20 | 0/20 | 3/20 |
| 400 times | 0/20 | 0/20 | 1/20 | 0/20 | 1/20 | 5/20 |
| 500 times | 0/20 | 0/20 | 2/20 | 0/20 | 2/20 | 5/20 |
| Moisture resistance reliability |  |  |  |  |  |  |
| Before PCT | 0/20 | 0/20 | 0/20 | 0/20 | 0/20 | 0/20 |
| 100 hours | 0/20 | 0/20 | 0/20 | 0/20 | 0/20 | 0/20 |
| 200 hours | 0/20 | 0/20 | 0/20 | 0/20 | 0/20 | 2/20 |
| 300 hours | 0/20 | 1/20 | 0/20 | 0/20 | 1/20 | 4/20 |
| 400 hours | 0/20 | 2/20 | 1/20 | 0/20 | 3/20 | 7/20 |
| 500 hours | 1/20 | 3/20 | 2/20 | 1/20 | 3/20 | 8/20 |

As shown in Table 22, it is clear from the results of Comparative Example (III-2) that when the tablet which is not covered by the spacer particles is employed, an adhesion would be generated among tablets irrespective of the kind of resin constituting the main body of tablet and it is impossible to separate the adhered tablets without causing a fracture of tablet. By contrast, the epoxy resin composite tablets of this invention can be maintained free from adhesion even if these tablets were left to stand for 100 hours at a temperature of 35° C., so that these tablets can be easily separated from each other without generating a fracture of tablet.

Further, as shown in Table 23, it is also possible in the case of the biphenyl type resin tablet to prevent the adhesion or blocking among tablets by covering the surface of the tablet with spacer fine particles as in the case of the aforementioned bisphenol F type resin. Therefore, when a resin-encapsulated semiconductor device is manufactured by making use of these tablets, the ratio of generating defective molding by the generation of voids can be greatly minimized, thus making it possible to improve the reliability of the semiconductor device.

Although this invention has been explained referring to the composite resin tablets which were manufactured using bisphenol F type resin or biphenyl type resin, it was found possible to obtain almost the same effects as obtained in the case of bisphenol F type resin even when bisphenol S type epoxy resin, diphenyl ether type epoxy resin, naphthalene type epoxy resin, or tri-functional type epoxy resin was employed in place of the aforementioned bisphenol F type resin or biphenyl type resin.

The samples involving these resins which were covered with fine particles consisting of an organic material were also evaluated regarding the adhesivity thereof, the results being summarized, together with the thermal characteristics of the organic fine particles, in the following Table 24.

TABLE 24

|  | Example III-4 | Example III-11 | Comparative Example III-3 | Example III-5 | Example III-12 | Comparative example III-4 |
|---|---|---|---|---|---|---|
| Initial stage | No trouble (adhesion is not found) | No trouble (adhesion is not found) | No trouble (adhesion is not found) | No trouble (adhesion is not found) | No trouble (adhesion is not found) | No trouble (adhesion is not found) |
| 35° C. After | Separated by | Separated by | Tablets are | Separated | Separated | Tablets are |

TABLE 24-continued

|  | Example III-4 | Example III-11 | Comparative Example III-3 | Example III-5 | Example III-12 | Comparative example III-4 |
|---|---|---|---|---|---|---|
| 15 hrs. | deadweight | deadweight | adhered | by deadweight | by deadweight | adhered |
| 35° C. After 100 hrs. | Separated by deadweight | Separated by deadweight | Tablets are adhered | Separated by deadweight | Separated by deadweight | Tablets are adhered |
| Thermal properties | Melting point 74° C. | Melting point 59° C. | Melting point 45° C. | Softening point 125° C. | Softening point 62° C. | Softening point 42° C. |
| Remarks | No trouble | No trouble | Tablets are fractured when separated | No trouble | No trouble | Tablets are fractured when separated |

The samples of Examples (III-4) and (III-11) and Comparative Example (III-3) were all covered by fine particles consisting of a wax, while the samples of Examples (III-5) and (III-12) and Comparative Example (III-4) were all covered by fine particles consisting of a resin. As shown in Table 24, the samples of this invention were all free from adhesion of tablets, whereas in the case of the samples of Comparative Examples wherein fine particles having a melting temperature or softening point of less than 50° C., the tablets therein were adhered to each other and could not be separated from each other without inviting a fracture of tablet. It will be seen from these results that if organic fine particles are to be employed, it is preferable to select from those having a melting temperature or softening point of 50° C. or more.

It has been confirmed that since the softening point of the epoxy resin composition constituting the main body of the resin tablet employed in these examples is about 55° C., the melting temperature or softening point of the fine particles is required to be higher than 55° C. by at least 10° C. in order to obtain excellent results.

The relationship between the size of fine particles to be employed for covering the surface of resin tablet and the reliability of a semiconductor device after molding is summarized in the following

TABLE 25

|  | Examples III-1 | Reference Example III-1 | Reference Example III-2 |
|---|---|---|---|
| Average particle diameter (μm) | 6 | 50 | 100 |
| Ratio of defective in initial stage | 0/20 | 2/20 | 13/20 |

The samples of Examples (III-1) and Reference Examples (III-1) and (III-2) were formed of the same composition except that the particle diameter of quartz filler employed as the fine particles was altered. Then, QFP184 pin frame was molded using each sample to manufacture resin-encapsulated semiconductor devices, of which were then investigated regarding the ratio of the initial defective.

As shown in Table 25, the semiconductor devices which were manufactured using a tablet (Reference Example (III-2)) covered by fine particles having an average particle diameter of 100 μm were found as being defective at a ratio of 50% or more even in the initial stage. It will be seen accordingly that a preferable range in size of the fine particles is about 50 μm or less in average particle diameter.

As explained above, the epoxy resin composite tablet which is covered on its surface with a specific kind of fine particles is substantially free from adhesion or blocking during the handling thereof, so that the epoxy resin composite tablet is substantially free from the generation of defective shape such as a fracture or deformation of tablet. Accordingly, it is possible, by encapsulating a semiconductor element with such an epoxy resin composite tablet, to manufacture a resin-encapsulated semiconductor device which is minimal in defective molding and excellent in reliability.

As explained above, it is possible according to this invention to provide an epoxy resin composition which is excellent in fluidity and which enables to manufacture a molded product which is minimal in void and burr. Further, it is possible according to this invention to provide an epoxy resin molding material which enables to manufacture a tablet which is substantially free from blocking and excellent in quality. Furthermore, it is possible according to this invention to provide an epoxy resin composite tablet which is capable of inhibiting the adhesion or blocking thereof.

Accordingly, it is possible, by encapsulating a semiconductor element with the epoxy resin material of this invention, to manufacture a resin-encapsulated semiconductor device which is minimal in defective molding and excellent in solder reflow resistance and moisture resistance reliability. The resin-encapsulated semiconductor device to be obtained by this invention is applicable to meet an increasing integration of electronic devices as well as to meet an increasing enlargement of semiconductor chip. Therefore, this invention is very valuable in industrial view point.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. An epoxy resin composition comprising: (a) an epoxy resin; (b) a curing agent; (c) a cure accelerator; and (d) silica powder, wherein said silica powder (d) is composed of;

(d1) a first silica powder having a particle diameter ranging from 5 to 75 μm;

(d2) a second silica powder having a particle diameter ranging from 0.2 to 0.9 μm; and (d3) a third silica powder having a particle diameter ranging from 0.01 to 0.08 μm.

2. The epoxy resin composition according to claim 1, wherein a mixing ratio of silica powder constituting said (d) component is 85 wt. % or more based on the entire resin composition;

mixing ratios of the (d1) component, (d2) component and (d3) component based on the total of silica powder are 50 to 90 wt. %, 10 to 35 wt. %, and 0.1 to 5 wt. %, respectively; and the weight ratio between the (d1) component and the (d2) component ((d1):(d2)) is in the range of 88:12 to 60:40.

3. The epoxy resin composition according to claim 2, wherein a content of silica powder constituting said (d) component is 95% by weight or less based on the entire resin composition.

4. The epoxy resin composition according to claim 1, wherein said epoxy resin is at least one of compounds represented by the following general formula (1) and (2);

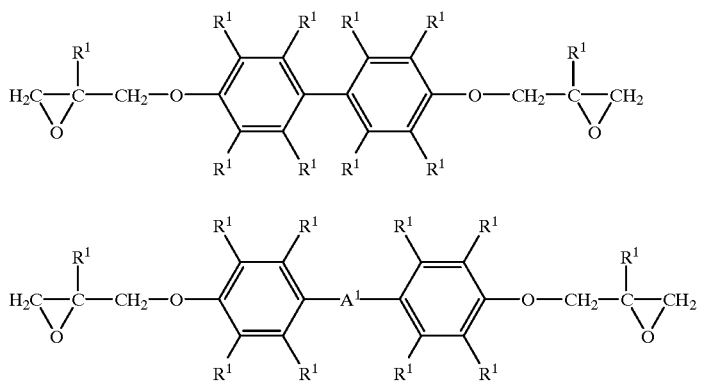

wherein R¹s may be the same or different and are individually selected from the group consisting of hydrogen atom, alkyl group, cycloalkyl group, aryl group and a halogen atom; and A¹ is a bivalent organic group.

5. The epoxy resin composition according to claim 1, wherein said curing agent is at least one of phenol resins represented by the following general formula (3) and (4);

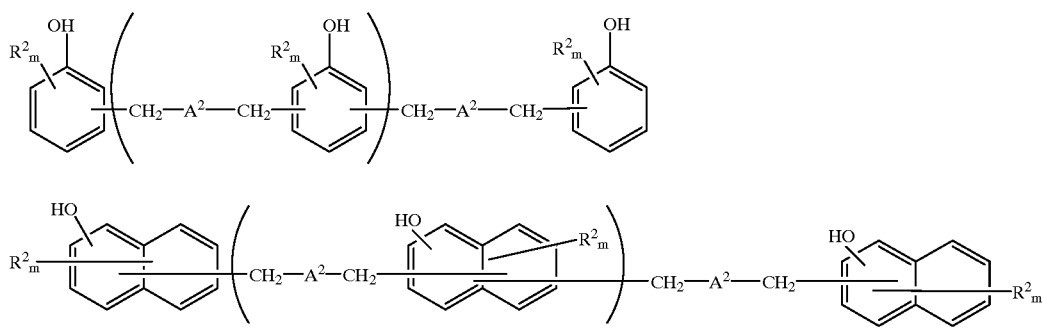

wherein R²s may be the same or different and are individually selected from the group consisting of hydrogen atom, alkyl group, cycloalkyl group, aryl group and a halogen atom; A² is a bivalent organic group selected from the group consisting of the following groups; m is an integer of 0 to 3; and n is an integer of 1 to 50.

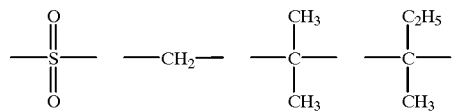

6. The epoxy resin composition according to claim 1, wherein said third silica powder is made hydrophobic.

7. The epoxy resin composition according to claim 1, wherein said silica powder constituting said (d) component contains 0.5 ppb or less of uranium or thorium.

8. A resin-encapsulated semiconductor device comprising: a semiconductor element; and a resin layer encapsulating said semiconductor element; wherein said resin layer is constituted by a cured body of an epoxy resin composition comprising (a) an epoxy resin; (b) a curing agent; (c) a cure accelerator; and (d) silica powder, wherein said silica powder (d) is composed of;

(d1) a first silica powder having a particle diameter ranging from 5 to 75 μm;

(d2) a second silica powder having a particle diameter ranging from 0.2 to 0.9 μm; and (d3) a third silica powder having a particle diameter ranging from 0.01 to 0.08 μm.

9. The resin-encapsulated semiconductor device according to claim 8, wherein a mixing ratio of silica powder constituting said (d) component is 85 wt. % or more based on the entire resin composition;

mixing ratios of the (d1) component, (d2) component and (d3) component based on the total of silica powder are 50 to 90 wt. %, 10 to 35 wt. %, and 0.1 to 5 wt. %, respectively; and the weight ratio between the (d1) component and the (d2) component ((d1):(d2)) is in the range of 88:12 to 60:40.

10. An epoxy resin molding material comprising: a powder of epoxy resin composition comprising an epoxy resin, a curing agent and an inorganic filler; and an inorganic fine particle covering the surface of said powder and having an average particle diameter of 1 μm or less.

11. The epoxy resin molding material according to claim 10, wherein said epoxy resin is at least one of compounds represented by the following general formula (1) and (2);

in the range of from 0.01 to 1 part by weight per 100 parts by weight of said epoxy resin composition.

14. The epoxy resin molding material according to claim 10, wherein said inorganic fine particle is at least one kind of fine particles selected from the group consisting of inorganic oxide fine particles, inorganic nitride fine particles, inorganic carbide fine particles and carbon black.

15. An epoxy resin composite tablet comprising: a tablet containing an epoxy resin composition comprising an epoxy resin, a curing agent and an inorganic filler;

and a fine particle covering the surface of said tablet; wherein said fine particle has a melting or softening temperature which is higher than those of said epoxy resin composition.

16. The epoxy resin composite tablet according to claim 15, wherein said epoxy resin is at least one of compounds represented by the following general formula (1) and (2);

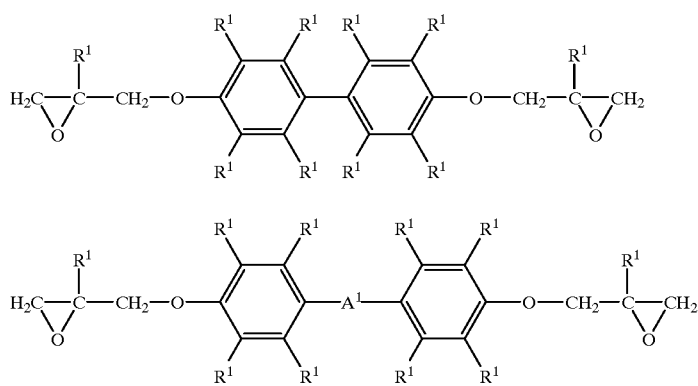

wherein R¹s may be the same or different and are individually selected from the group consisting of hydrogen atom, alkyl group, cycloalkyl group, aryl group and a halogen atom; and A¹ is a bivalent organic group.

12. The epoxy resin molding material according to claim 10, wherein said inorganic fine particles has an average particle diameter ranging from 0.001 to 0.1 μm.

13. The epoxy resin molding material according to claim 10, wherein a mixing ratio of said inorganic fine particle is

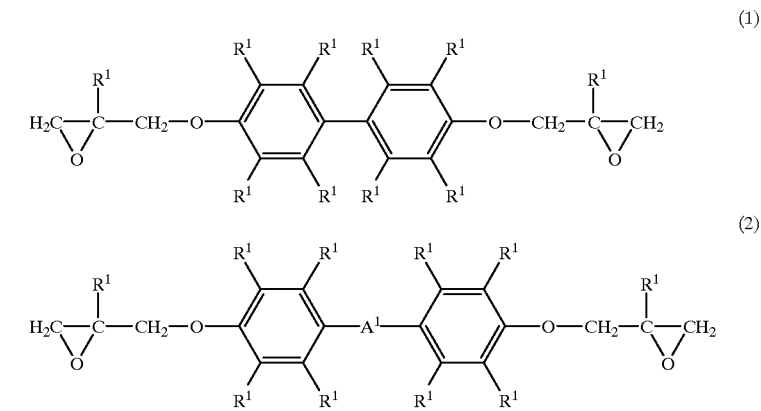

wherein R¹s may be the same or different and are individually selected from the group consisting of hydrogen atom, alkyl group, cycloalkyl group, aryl group and a halogen atom; and A¹ is a bivalent organic group.

17. The epoxy resin composite tablet according to claim 15, wherein said fine particle is formed of at least one kind of material selected from the group consisting of an inorganic oxide material, an inorganic nitride material, an inorganic carbide material, a powder of a thermosetting resin composition which differs in composition from the epoxy resin composition constituting the main body of the tablet and an organic material having a melting or softening point of 50° C. or more.

18. The epoxy resin composite tablet according to claim 17, wherein said fine particle is formed of a silicon ball.

19. The epoxy resin composite tablet according to claim 15, wherein an average particle diameter of said fine particle is 50 $\mu$m or less.

20. The epoxy resin composite tablet according to claim 15, wherein a melting or softening point of said fine particle is higher than a melting or softening point of the epoxy resin composition by 10° C. or more.

* * * * *